United States Patent [19]

Paufve

[11] 4,050,017
[45] Sept. 20, 1977

[54] SEQUENCE COMPONENT TESTER
[75] Inventor: Eldred H. Paufve, Windsor, N.Y.
[73] Assignee: Universal Instruments Corporation, Binghamton, N.Y.
[21] Appl. No.: 668,656
[22] Filed: Mar. 19, 1976
[51] Int. Cl.² ........................................ G01R 15/12
[52] U.S. Cl. .............................. 324/73 AT; 324/57 R; 324/62; 235/153 AC; 324/60 C
[58] Field of Search ............ 324/73 AT, 73 R, 57 R, 324/60 C, 62, 158 D; 235/153 AC

[56] References Cited
U.S. PATENT DOCUMENTS

| | | | |
|---|---|---|---|
| 3,039,050 | 6/1962 | Krohn | 324/57 |
| 3,139,579 | 6/1964 | Gravel | 324/57 |
| 3,226,637 | 12/1965 | Hempel | 324/57 |
| 3,319,162 | 5/1967 | Sattinger et al. | 324/57 |
| 3,593,126 | 7/1971 | May | 324/57 R |
| 3,624,495 | 11/1971 | Freund | 324/62 R |

Primary Examiner—Rudolph V. Rolinec
Assistant Examiner—Vincent J. Sunderdick
Attorney, Agent, or Firm—Fidelman, Wolffe & Waldron

[57] ABSTRACT

A digitally controlled two legged bridge comprising a component under test and a reference resistor selected from a decade ladder as a function of the exponent of the value of the component under test. A drive signal, whose amplitude is a function of the significant digits of the value of the component under test, and a reference signal are connected to selected points on the bridge in the appropriate waveform as a function of the component under test. The output of the bridge is fed back to the drive signal to balance the bridge and is compared with acceptable percentage error levels, for the component under test.

27 Claims, 27 Drawing Figures

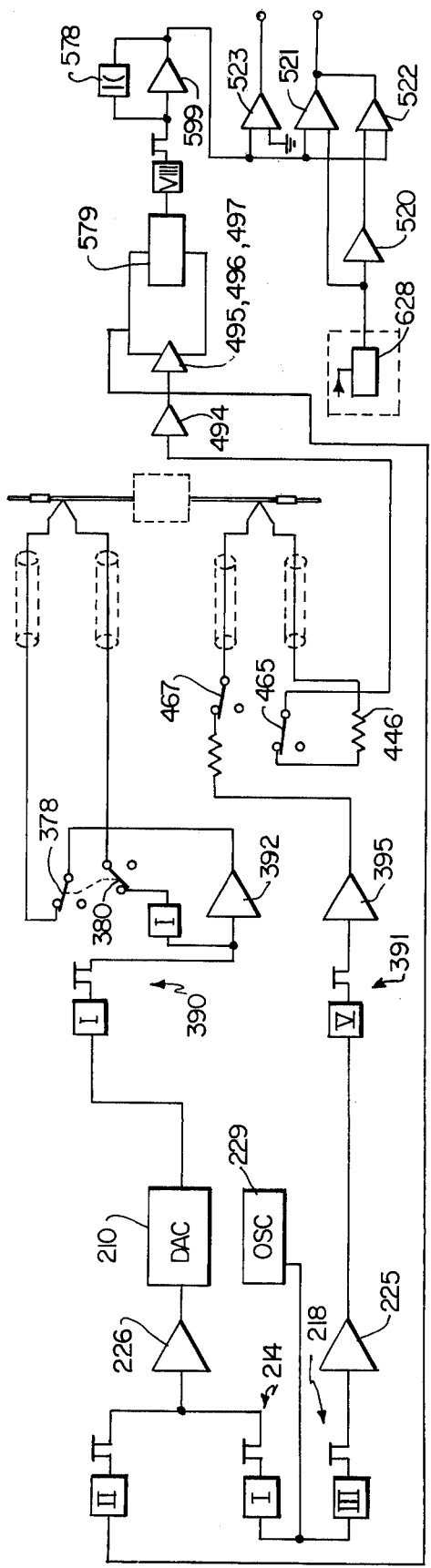
FIG. 13 RESISTOR
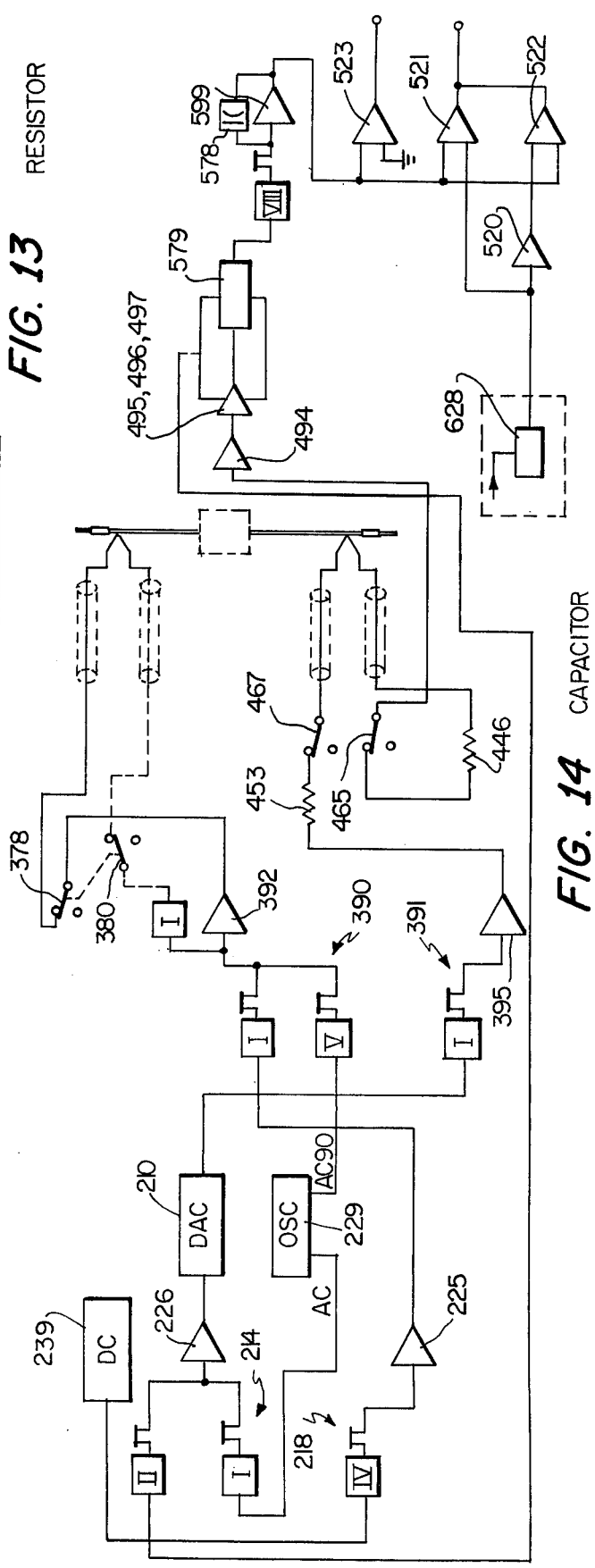
FIG. 14 CAPACITOR

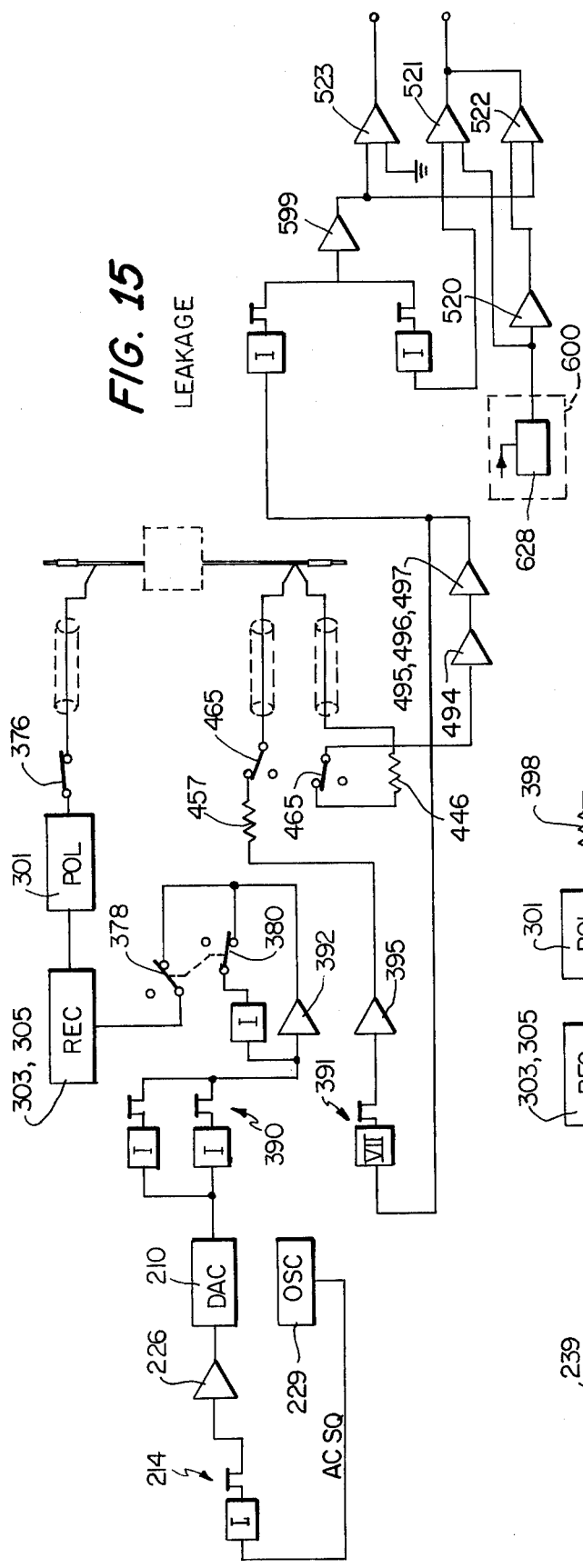
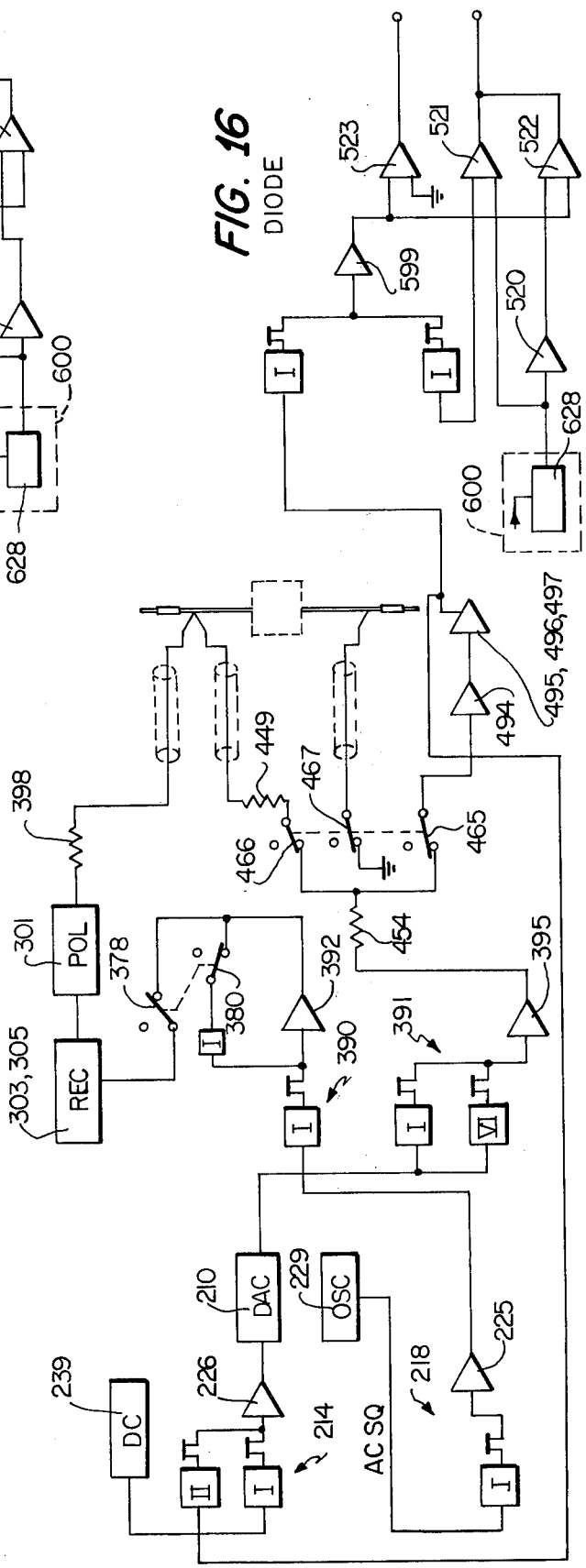

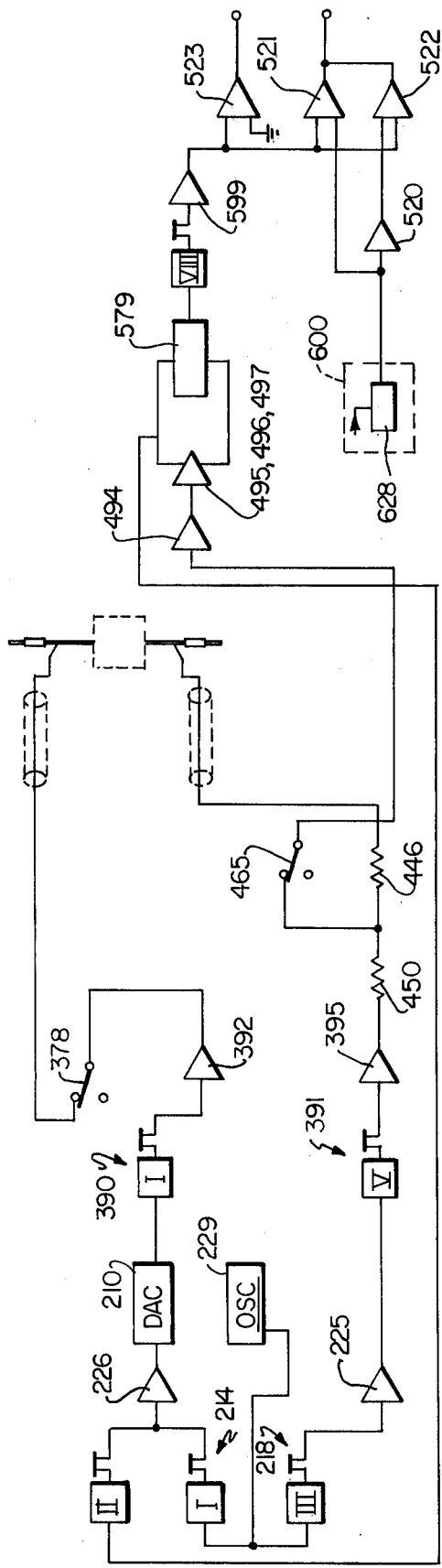
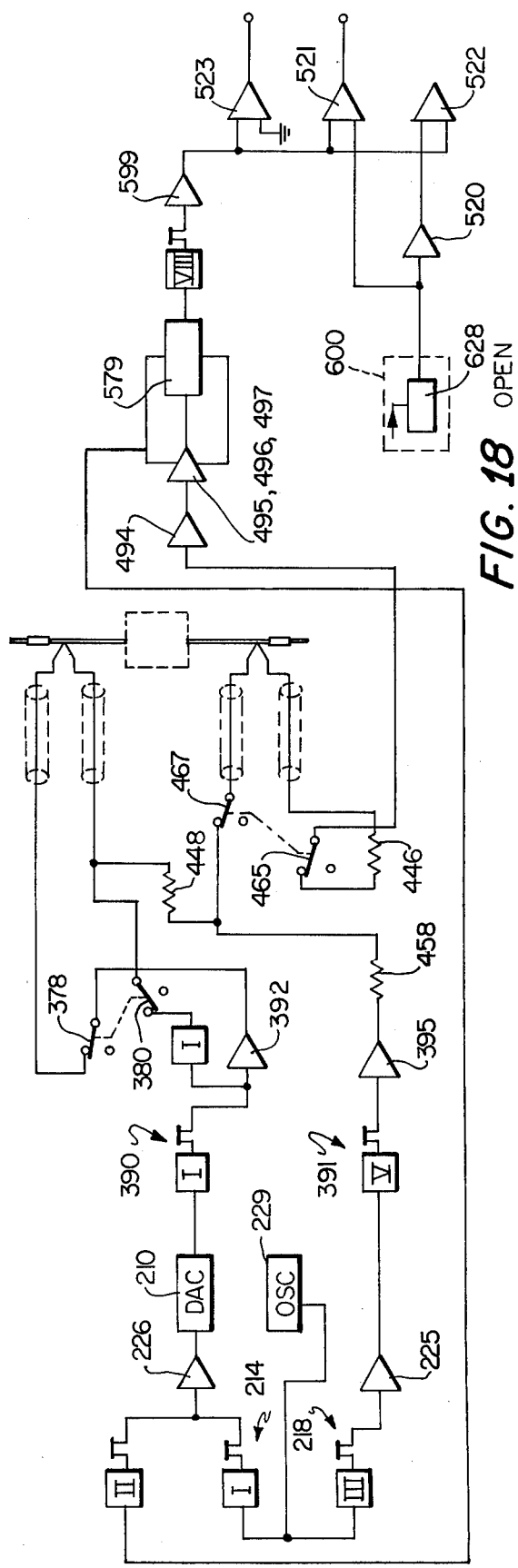
FIG. 17 SHORT
FIG. 18 OPEN

SEQUENCE COMPONENT TESTER

BACKGROUND OF THE INVENTION

1. Field of the Invention

The present invention relates generally to electrical component testers and more specifically to a digital controlled bridge for rapidly testing a plurality of types of electrical components and their sequence of presentation.

2. Description of the Prior Art

Most bridge circuits for measuring impedance are modifications of the standard Wheatstone four legged bridge. To balance the potential across the bridge, adjustments are usually made on two of the bridge elements. If the adjustments are known, the unknown impedance can then be calculated from the known impedance and the two known adjustments. A sophisticated system using a computer to drive relays to adjust the bridge to a null is shown in U.S. Pat. No. 3,319,162.

To increase the speed of measurement of a resistance and reduce the amount of parts of mechanization, others have used self-balancing bridges where a resistor under test is connected in a two or four legged bridge with a standard resistance and the signal at the junction between the standard and test resistance is fed back to the voltage applied at one end of the bridge to drive the bridge into balance. The final output of the junction represents the measured percentage of error of the test resistance or device under test to the standard resistance. Two U.S. Pat. Nos. showing this technique are 3,039,050 and 3,139,579. Other attempts of digitally forming a bridge have included the selection from a large plurality of standard resistors, using relay switches, to provide a standard resistor in a two legged bridge with a device under test. The output signal of these digitally controlled bridges is measured against an inputted tolerance signal to provide a pass or fail information. Two U.S. Pat. Nos. showing these type of circuits are 3,065,414 and 3,226,637.

With the increased use of electrical components taped between two pairs of adhesive ribbons for use in electrical component insertion machines of the component, it is important to verify the sequence of components intermixed as to type and value and the value tolerance within a predetermined range. By making the component sequence check on the taped components before feeding them to an insertion machine, time and labor are saved over the complicated testing of the assembled circuit. Additionally, the components do not have to be unsoldered and removed, thus saving time, manpower and money. Two of such mechanized testers are shown by U.S. Pat. Nos. 3,092,253 and 3,629,702. The prior art, as exemplified by the patents discussed above, do not combine the teachings of the prior art to provide a digitally controlled sequenced component tester using a self-balancing bridge for a wide variety of electrical components and including a minimum number of resistor values and mechanical switching.

SUMMARY OF THE INVENTION

The present invention provides a digitally controlled two legged bridge comprising a component under test and a reference resistor selected from a decade ladder as a function of the exponent value of the component under test. A signal generator provides, as a function of the component under test, an AC or DC test signal, whose amplitude is a function of the significant digits of the value of the component under test, and an AC or DC reference signal. These two signals are slectively connected to points on the two legged bridge as a function of a component under test. The output of the bridge is fed back to be added to the test signal to electrically balance the bridge and is also compared in an error detector with a voltage proportional to the acceptable percentage error level for the device under test. The sequence tester is capable of testng resistors, capacitors, diodes, opens, shorts and performing leakage test on capacitors and diodes. The test signal uses a signal from the same AC or DC source as the reference signal and attenuates the signal as a function of the significant digits of the value of the component under test. A multiplying digital to analog converter performs this attenuation. By using the significant digits of the value of component under test to attenuate the input signal, a decade resistor ladder can be used as the standard or reference portion of the two legged bridge, whereas the prior art uses a plurality of resistors to provide resistively a standard resistance.

For a resistor test, an AC test signal is transmitted to one side of the component under test and an AC reference signal is connected to one side of a selected member of the decade ladder. The signal at the junction is amplified and is fed back to the drive signal source. For capacitance test, an AC test signal is connected to one side of a selected member of the decade ladder, an AC reference signal in quadrature phase reference to the drive signal is connected to one side of the component under test. The juncture signal is amplified and is fed back to the drive signal source. For polarized capacitors, a DC level shift is performed on the reference signal (to the capacitor under test) to provide a unipolar AC reference signal. For diode test, a DC test signal is provided to one side of a selected member of the decade ladder. The diode under test is grounded at one end and the other end of the diode is driven with a DC current from a rectified AC reference signal. The voltage across the diode is sensed by a resistor connected between the ladder and the ungrounded end of the diode and forms the other leg of the bridge. The amplified output of the bridge is fed back to the test signal source. For test of shorts, an AC test signal is connected to the shorted contacts in series with a fixed resistor, an AC reference signal is connected to the other end of another selected resistor, and the amplified output of the bridge is fed back to the test signal source. For open test, an AC test signal is connected to one side of a fixed resistor connected in parallel across the open contacts, an AC reference signal is connected to one side of a second resistor forming the second leg of the bridge, and the amplified output signal is fed back to the drive signal source. For leakage test, an AC drive signal, rectified to a predetermined magnitude and polarity is connected to one side of the component under test. A selected member of the decade bridge is connected as the reference resistor and fed to the amplified output of the bridge as its only signal. Thus, for the leakage test, the bridge functions as a feedback amplifier.

The error detector includes a synchronous rectifier, an integrator and comparing means for comparing a digitally generated DC acceptance level of percentage error signal with the measured percentage error signal from the bridge. The synchronous rectifier and integrator are disabled or bypassed for the leakage and diode tests. For extremely large values of capacitance, the frequency of oscillation of the AC signal source in the signal generator is decreased. A memory element which receives the binary value of the tolerance or acceptable level of percentage error is also used as a counter and driven by test control logic to increment the stored tolerance until the component under test passes or is within limits. The memory element, consequently, has the measured value of percentage error which may be read out.

A polarity switch is provided, for use in the diode value test and the diode and capacitor leakage test in the circuit interconnecting the drive and reference signal to the bridge, which comprises four photo sensitive transistors connected in a bridge configuration with diagonal legs simultaneous activated by appropriate light emitting diode. Speed, accuracy, reliability and other versatile features of using digital logic are provided by the sequence tester of the present invention.

OBJECTS OF THE INVENTION

An object of the present invention is to provide an improved electrical component self-balancing error sensing bridge.

Another object is to provide a digitally controlled self-balancing error sensing bridge.

A further object of the invention is to provide a digitally controlled bridge which tests the sequence and the tolerance values of components presented in sequence between two pairs to taped ribbons.

Still another object is to provide a versatile bridge capable of testing values of resistors, capacitors and diodes, sensing shorts and opens, and performing leakage tests on capacitors and diodes.

Still another object of the invention is to provide a bridge whose formation is a function of the test to be performed.

Another object of the invention is to provide a bridge whose test voltage is a function of the significant digits of the value of the component under test and the standard resistor is a single member of a decade ladder selected as a function of the exponent value of the component under test.

An even further object of the present invention is to provide a bridge using a minimum number of mechanical switches and resistors and maximizing the use of digital logic to test a plurality of types and values of electrical component.

A further object of the invention is to provide a digitally controlled brige having a tolerance memory unit which is incremented after a failed test to provide a binary word representing the measured percentage error.

Still another object is to provide a polarity switch using light emitting diodes and photo transistors.

A further object of the present invention is to provide a high speed bridge coupled to a mechanical handler which can test a variety of intermixed parts under computer control.

A further object of the present invention is to provide a means for rapidly testing a multiplicity of nominally identical parts to determine automatically an error distribution curve of a measured parameter of those parts about the nominal value.

Other objects, advantages and novel features of the present invention will become apparent from the following detailed description of the invention when considered in conjunction with the accompanying drawings.

BRIEF DESCRIPTION OF THE DRAWINGS

FIG. 13 is an equivalent circuit of the Test Station Electronics for a Resistor Test.

FIG. 14 is an equivalent circuit of the Test Station Electronics for a Capacitor Test.

FIG. 15 is an equivalent circuit of the Test Station Electronics for a Leakage Test.

FIG. 16 is an equivalent circuit of the Test Station Electronics for a Diode Test.

FIG. 17 is an equivalent circuit of the Test Station Electronics for a Short Test.

FIG. 18 is an equivalent circuit of the Test Station Electronics for an Open Test.

DESCRIPTION OF THE PREFERRED EMBODIMENTS

Figure 1:
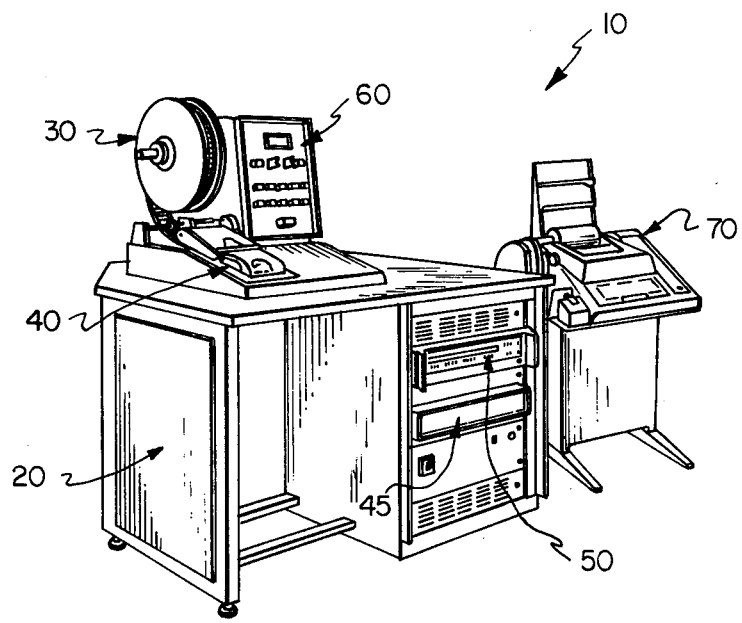
FIG. 1 is a perspective view of the Sequence Component Test of the present invention.

The Sequence Component Tester is designed to test previously sequenced and taped axial lead components to verify that each component is in the proper sequence and is within specified tolerance of the nominal value. The Tester is useful as well, for incoming inspection of a wide variety of nonsequenced taped components generating an error distribution curve for acceptable quality level (AQL) parts evaluation. The machine will test the values of resistors and capacitors; test the forward voltage drop of diodes; zener voltage and forward voltage drop of zener diodes; test leakage of capacitors and diodes; as well as test for opens and shorts. Out-of-tolerance components cause the testing to stop for manual replacement of the component. A replace component is tested when the testing process is restarted. As illustrated in FIG. 1, the Sequence Component Tester 10 is composed of a console 20, tape reel drives 30, a test station 40, test station electronics 45, central processing unit 50, a control panel 60 and Teletypewriter 70.

The console 20 provides a mounting frame for the various machine assemblies and a table work surface for the operator. The frame and control cabinet assemblies are joined together, enclosed with panels, and provide physical support for the remaining assemblies.

Two tape reel drive assemblies 30 are used on the machine. Tape feed is from a feed/rewind reel, through the test station 40, and onto a takeup reel. Each reel is independently driven to perform its specific function. Taped components may be fed to a storage container (not shown) if it is desired to reload them onto the feed reel rather than having them reeled on the takeup reel. For operating in this mode the takeup reel drive unit may be turned off by the operator.

Taped components are indexed, by a pair of pitch wheels, through the test station 40. As each component is indexed into the test position, a set of probes make electrical contact with each lead to complete a test circuit. The probes, located at position indicated as test station 40 in FIG. 1, are connected to the test station electronics 45 housed adjacent to the central processing unit 50 in the control cabinet assembly of the console 20. Parametric testing of resistors and capacitors is accomplished by the test station electronics 45 through the use of an asymetrically-driven AC bridge circuit. In this bridge, the component is balanced against a decade reference resistance, using a reference AC voltage and an AC voltage scaled to the significant digits of the component value. Any bridge unbalance is amplified and fed back to the scaled bridge drive such that the output is proportional to the component's error ratio or percentage.

The output error percentage is compared with programmed tolerance limit level; a within-tolerance measurement will cause the system to advance to the next test, and out-of-tolerance measurement will cause a single retest of the component. If the second test still reads the measurement out-of-tolerance, advancing to the next test is inhibited, the FAIL indicator is turned on, the sequencer head number is displayed on the control panel numerical readout, and the equipment measures and reads out, through the Teletypewriter 70, the error percentage (tolerance) of the faulty component.

By observing the numeraical panel readout, the operator can determine which sequence head dispensed the faulty component thus identify and retrieve a new component for replacement. After replacing a faulty component, depressing the RETEST push button will cause the equipment to test the replaced component. Depressing the START push button will re-initiate automatic component testing.

Testing of diode voltage, and capacitor and diode leakage current make use of internally generated DC voltages applied to a modified bridge circuit. These test utilize the same principles for tolerance testing as described above for resistor and capacitor parameter testing.

A processor (computer), input/output chassis (I/O Box), Teletypewriter, power chassis, and interfacing cable comprise the central processing unit (CPU) 50. With the exception of the Teletypewriter 70, all component parts of the CPU are housed in the control cabinet assembly of the console 20.

The processor is a stored program, mini-computer. The processor stores the test descriptions, in the form of a pattern program, for several component sequences. It also controls the operation of the Tester and compiles statistical management information. Pattern program data is entered into the processor memory using the Teletypewriter 70. As will be explained more fully in detailed description of the test station electronics 45, the processor need not be a memory containing computer. In lieu of memory, the processor could be decoder and timing logic driven by a punched or magnetic tape having the component test recorded in sequence.

The Teletypewriter 70 serves as the communication link between the processor and the operator. The operator enters or requests information from the processor by specific commands entered through the Teletypewriter keyboard; and the processor provides the operator with data using the page printer of the Teletypewriter. Mounted on separator stand, the Teletypewriter 70 may be positioned convenient to the operator.

The control panel 60 is located to the right of the test station 40 and within easy reach of the operator. It contains controls and indicators necessary for the operation of the Sequence Component Tester. Visual displays include status indicators for normal, in-tolerance component testing; out-of-tolerance test failure conditions; and a digital readout display. The panel also contains an auxiliary test position for manual testing of individual components and push button switches for operator control of the Tester.

Since the console 20, tape reel drives 30, control panel 60 and Teletypewriter 70 are considered to be state of the art assemblies, they will not be described in any further detail. The following detailed description will begin with the central processing unit 50 and the test station electronics 45 and concluded with a detailed description of the test for the different type of components previously enumerated.

CENTRAL PROCESSING UNIT 50

In a preferred embodiment, the central processing unit 50 uses a memory computer, for example a General Automation SPC 12 or a Digital Equipment Corporation PDP 11/05 computer, to provide the control signals of the test station electronics, to store test information, and to compile statistical management data.

Test pattern information is stored in a single table containing the sequencer head number for the component and a description of the test to be made on the component. Two or more entries may be made for a single component where more than one test is desired on that component. Alternately, test pattern information could be stored in two tables: A Test Table containing the descriptions of the tests for the various components according to sequencer head number, and a Head Sequence Table containing the sequence of head numbers used in making up a complete sequence of components. The format for the Head Sequence Table could then be the same used in Universal Instruments Component Sequencer Model 2583. A third small auxiliary table might then be provided to address more than one test in the Test Table for a given component rather than providing multiple test entry provisions for all components.

The data for the Test Table is described to the computer as a string of characters in the form:

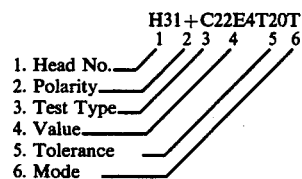

The Head number is the letter H followed by up to three numbers indicating sequencer head number. The Polarity (+, −, or / (slash)) indicates positive, negative or non-polar voltage respectively to be applied to the part under test. The Test Type is one of the following indicating the type of test to be performed:

| | | |
|---|---|---|
| R = Resistor | O = Open | L = Leakage ($I_L$) |
| C = Capacitor | S = Short | |

-continued

| | |
|---|---|
| D = Diode (V_f) | Z = Zener Diode (V_z) |

The Value is a numerical representation of the component value to be tested, in the manner of standard component coding, i.e., two significant digits and an exponent. Significant digits are nominally 10 to 99; however, the equipment as currently embodied is designed to accept numbers to 120. If so designed, the numbers 100, 110, 120 are to be preferred over 10, 11 or 12 for reason of greater resolution and accuracy. The exponent is represented by the letter E followed by a single exponent digit 0 to 6 relative to a standard measurement unit as follows:

Resistors — ohms
Diodes — millivolts
Capacitors — picofarads
Leakage — nanoamperes The tolerance is represented by the letter T followed by two digits. For all tests except leakage, the two digits indicate a tolerance percentage up to 30%. For leakage tests, the two digits are used to input the rated voltage of the device up to 99. Approximately 90% of this voltage is applied to the device during the leakage tests. A tolerance percentage of 9 has a special significance; in this case the component is never failed, however, the error percentage measurement for the component is made and each such component is tallied according to the error measurement so that data for an error distribution histogram is assembled and available for later printout.

The Test Mode is a single character suffix denoting the operating mode of the equipment as follows:

T = test complete, indicates a final test on a component; i.e., make test and advance to next component if O.K.

A = additional test, indicated that at least one additional test is to be made on that component; i.e., make test and advance to next test on same component.

N = no test, the test described is not actuated; the equipment advances to the next component. (Must be entered as an edit to a valid test description.)

The input test data is converted, decoded or translated by the computer into binary signals used to drive, control and time the sequence of data and test performed by the test station electronics 45. The specific signals provided to the test station electronics are:

| | |
|---|---|
| DO 0 through 7 | An eight bit Data Word representing the component value, the tolerance percent or a composite representation of the component type/exponent/polarity. |
| DTOF | Data (DO-0-7) transfer out of the computer, function command |
| DTOP | Data (DO-7) transfer out of the computer, pulse actuation |
| DSFO | Data Select Function designating the component type/exponent/polarity word |
| DSF1 | Data Select Function designating the component value word |
| DSF2 | Data Select Function designating the Tolerance percent word |
| DCPO | Data Control Pulse (Index) - System reset for new component test |
| DCP1 | Data Control Pulse (STST) for start test |
| DCP2 | Data Control Pulse (RTOL) for Read Tolerance Test |
| DTIF | Data (DIO-7) transfer into the computer, function command |
| DTIP | Data (DIO-7) tranfer into the computer, pulse actuation |
| SYRT | System reset at power on |

As previously noted, these signals may be provided from other sources than a memory computer. The operation of a preferred embodiment of the test station electronics 45 is dependent on the data and control signals, not their source.

The data and control signals returned to the computer from the test station electronics 45 are:

| | |
|---|---|
| Di 0 through 7 | An eight bit data word representing the measured percentage error |
| DTFO | Data test function - (IPOS) component in position |
| DTF1 | Data test function - end of test (EOT) |
| DTF2 | Data test function - passed test (PAS) |
| DTF3 | Data test function - Tolerance Ready (TRED) |

Based on the data received from the test station electronics, the computer tallies statistical data and outputs failure data if appropriate. With each failure the Sequencer Head Number of the component under test is displayed and component orientation indicated. The equipment will (unless inhibited by pushbutton command) also type out on the Teletypewriter 70 the sequencer head number, the test description of each component that failed and the measured percentage error (tolerance) of that component to ½% resolution. For leakage tests, the printout indicates the significant digits of the leakage current in steps of 2.0 to the exponent given in the test description.

During any period of operation, the computer will tally overall test and operator control statistics. This information includes: good component count, failed test count, components bypassed, on time, run time, etc. Also available upon Keyboard command are a tabular printout of the error distribution data collectively for any parts specified for a 0% tolerance; a tabulation of the patterns stored, and printout of individual patterns or specific tests in those patterns. Changes of test descriptions are readily made through Keyboard inputs.

TEST STATION ELECTRONICS 45

Figure 2A:
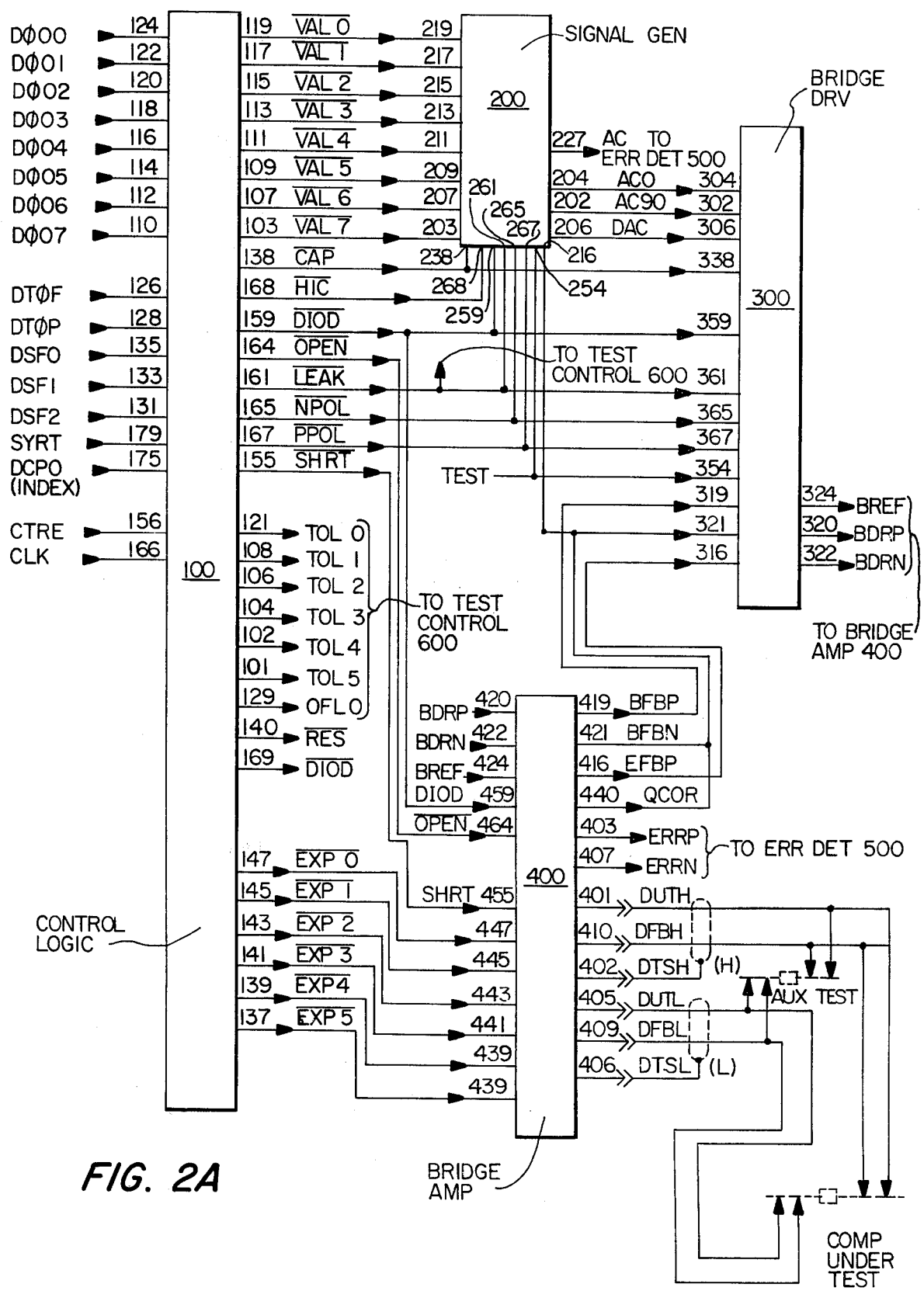
FIGS. 2 A and B are a block diagram of the Test Station Electronics.
Figure 2B:
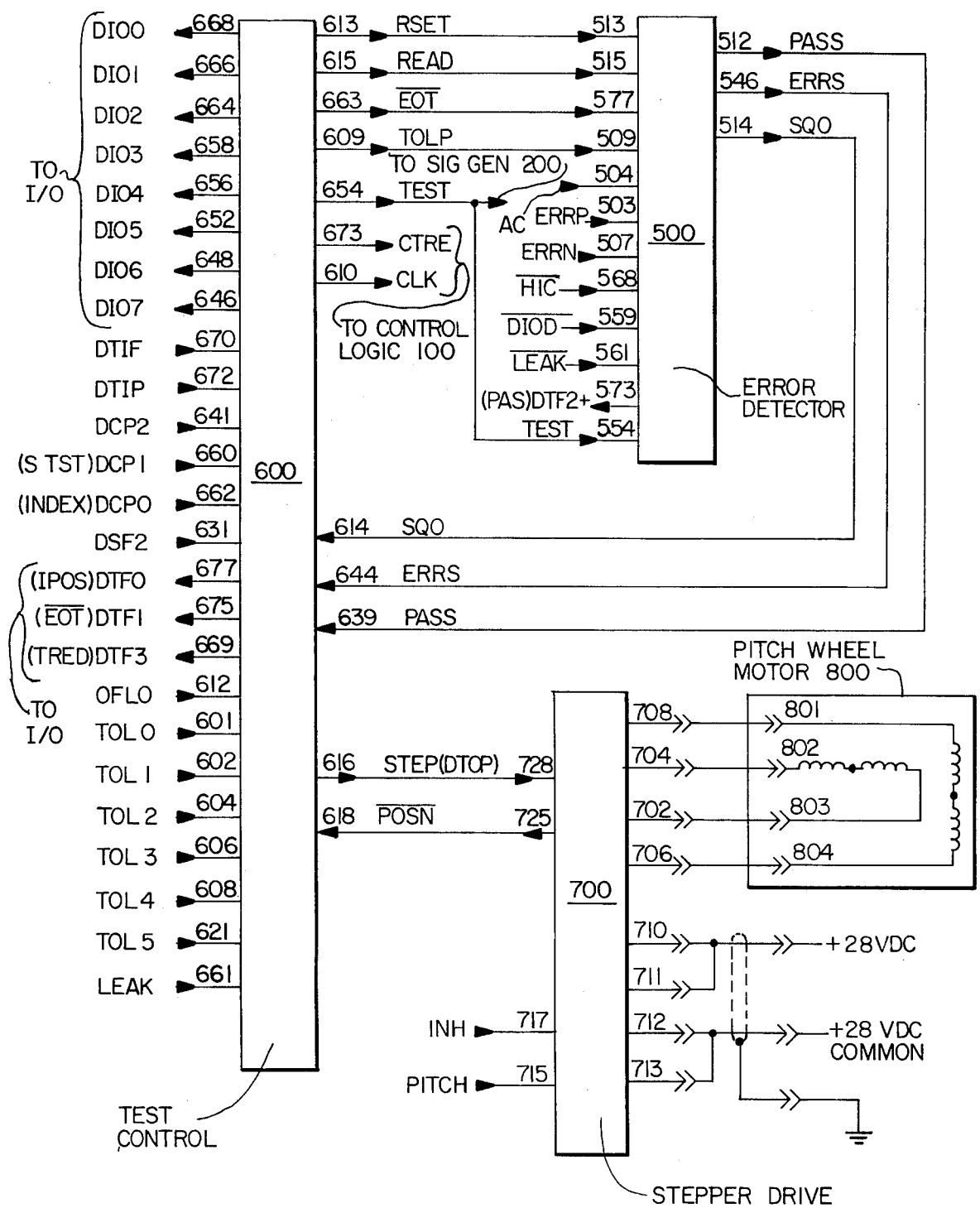

A block diagram of the test station electronics 45 is shown in FIGS. 2a and 2b, as including Control Logic 100, Signal Generator 200, Bridge Driver 300, Bridge-Amplifier 400, Error Detector 500, Test Control 600, Stepper Drive 700 and Step Motor 800. Details of each of the subassemblies are shown in FIGS. 3 through 9 except for the Step Motor 800 which is a conventional stepping motor.

As shown in FIGS. 2a and 2b, the input signals, which preferably come from the computer described in the previous section, include the eight bit binary word DO 0 through 7 to inputs 124, 122, 120, 118, 116, 114, 112 and 110, data transfer function and pulse (DTOF, DTOP) to terminals 126 and 128, data selection functions (DSF 0 through 2) to terminals 135, 133 and 131, system reset (SYRT) to terminal 179 and data control pulse (DCPO-INDX) to terminal 175. There are two other inputs to the Control Logic 100 from Test Control 600 which include the clock pulse (CLK) at terminal 166 and a counter-enable pulse (CTRE) at terminal 156.

As will be explained more fully in the explanation of FIGS. 3a and 3b, the input signals to Control Logic 100 produce control and data signals which include an eight bit binary number representing the significant digits of the component under test VAL 0 through 7 at terminals 119, 117, 115, 113, 111, 109, 107 and 103 transmitted to terminals 219, 217, 215, 213, 211, 209, 207 and 203 of the Signal Generator 200, and the type of component being tested by the assertion of one of the lines designated by symbols RES, CAP, HIC, DIOD, OPEN, LEAK and SHRT, appearing at terminals 140, 138, 168, 159, 164, 161 and 155 respectively, and one of the polarity lines, NPOL and PPOL at terminals 165 and 167, if appropriate. Remaining outputs include six lines, one of which by assertion, represents the selected exponent (EXP 0 through 5) at terminals 147, 145, 143, 141, 139, 137 and a six bit binary number representing the tolerance (TOL 0 through 5) at terminals 121, 108, 106, 104, 102, 101. The tolerance terminals are also used to represent the measured percentage error at terminal 129.

The type of test is communicated by the assertion of a selected line connected to the various subassemblies including the Signal Generator 200, the Bridge Driver 300, the Bridge-Amplifier 500, and the Error Detector 500. The exponent value (EXP) is used in the Bridge Circuit 400 and the tolerance level (TOL) is used in the Test Control Circuit 600.

In addition to the significant digits inputs VAL 0 through 7 at terminals 219, 217, 215, 213, 211, 209, 207 and 203 and the type of test CAP, HIC, DIOD, LEAK and polarity, if appropriate, NPOL, PPOL, inputs at terminals 238, 268, 259, 261, 265, 267 from Control Logic 100, Signal Generator 200 receives a TEST input on terminal 254 from Test Control 600 and a bridge error feedback (EFBP) on terminal 216 from the Bridge-Amplifier 400. Using these inputs, the Signal Generator 200 provides an AC timing signal AC at terminal 227 to the Error Detector circuit 500 at its terminal 504, and AC or DC signal ACO selectively attenuated as a function of the type of test at terminal 204 to Bridged Driver terminal 304; AC signal AC90, having a phase shift of 90° relative to ACO at terminal 202 to terminal 302 of the Bridge Driver 300; and an analog signal, DAC, calculated as the product of an AC or DC signal, selected as a function of the type of test, and the binary number given by VAL 0 through 7 by means of multiplying digital-to-analog converter, at terminal 206 to terminal 306 of the Bridge Driver 300.

The Bridge Driver Circuit 300 uses the assertion of one of the lines representing the type of test CAP, DIOD, LEAK plus a polarity line NPOL, PPOL, if significant, at terminals 338, 359, 361, 365 and 367 respectively, to select, attenuate, combine and direct the three analog input signals AC90, ACO and DAC at terminal 302, 304 and 306 from Signal Generator 200; the bridge error feedback SIGNAL (EFBP) at terminal 316, bridge feedback positive and negative signals (BFBN and BFBP) at terminals 319 and 321 to produce bridge positive, negative and reference drive signals at terminals 320, 322 and 324 respectively.

The Bridge-Amplifier circuit 400 uses the assertion of one of the lines describing the test for OPEN or SHRT or one of the lines representing the exponent value (EXP 0 through 5) at terminals 464, 455, 447, 445, 443, 441, 439, 437 and DIOD at terminal 459 if appropriate from Control Logic 100 to construct with the component under test an appropriate bridge. Bridge drive signal BDRP, at terminal 420 from Bridge Driver 300, is applied at terminal 401 to one end of the component under test (CUT) and bridge drive signal BDRN at terminal 422 is applied to one end of a resistance (selected as a function of the type of test and exponent value) forming a second leg of the bridge. Bridge feedback positive and negative signals (BFBN, BFBP) from terminals 421 and 419 of Bridge-Amplifier 400 to terminals 321 and 319 of Bridge Driver 300, the bridge signal BREF at terminal 424 from Bridge Driver 300 is used as a reference in the amplifier portion of the Bridge-Amplifier 400. Six lines at terminals 401, 402, 405, 409 and 410 connect the Bridge-Amplifier circuit 400 to the component under test at test station 40 and the auxiliary test probes. The six lines make use of the Kelvin contact philosphy by using a drive and sense line for each terminal of the component under test and a cable shield. The output amplifier portion of the Bridge-Amplifier 400 is connected to the junction of CUT and the selected resistance to provide the bridge error feedback signals (EFBP) from terminal 416 to terminals 316 and 216 of the Bridge Driver 300 and Signal Generator 200, to provide error positive and error negative signal (ERRP, ERRN) at terminals 403 and 407 to the Error Dector circuit terminals 503 and 507, and to provide signals to the component under test at terminal 406.

The Error Detector circuit 500 uses as input signals the positive and negative error signals ERRP, ERRN on terminals 503, 507 from Bridge-Amplifier 400. For all tests except those defined by assertion of DIOD or LEAK at terminals 559, 561 these signals are synchronously rectified and integrated using AC reference signal AC on terminal 504 from the Signal Generator 200. For DIOD or LEAK test, the synchronous rectifier is bypassed and the integrator functions as a unity gain amplifier. The HIC signal at terminal 568 changes the gain of the integrator for large capacitance. In all cases the output of the integrating amplifier is compared in a window detector with a DC voltage TOLP at terminal 509, proportional to the tolerance limits at terminal 609 from the Test Control circuit 600. The results of the comparison are transmitted from the Error Detector 500 to the Test Control 600 as a pass test signal (PASS) from terminal 512 to terminal 639, and error sign signal (ERRS) from terminal 546 to terminal 644, and to the computer as data test function DTF2 ($\overline{PAS}$) from terminal 573. The Error Detector 500 receives the following timing signals from the Test Control circuit 600: TEST at terminal 554, reset (RSET) at terminal 513, a read signal (READ) at terminal 515 and end-of-test (EOT) at terminal 577, and provides a square wave signal SQO used by the synchronous rectifier at terminal 614 of the Test Control 600 where it will be used to produce clock signals.

The Test Control circuit 600 provides the timing signals for the operation of the test station electronics. The SQO signal at terminal 614 is used in the Test Control 600 to provide a clock signal CLD from terminal 610 to terminal 166 of the Logic Control 100 where is is used after a fail to advance the tolerance counter to sense the measured percentage error. The clock signal is also used in the Test Control circuit to drive counters for timing the operation of the test circuits via the reset signal RSET, the read signal READ and the end-of-test signal EOT from terminals 613, 615 and 663 to the Error Detector 500. The counters are controlled by start test (STST) and index (INDX) data control pulses (DCPl, DCPO) at terminals 660, 662 from the computer and the LEAK signal at terminal 661 from Logic Control 100. The STST signal also produces the signal TEST at terminal 654 to Signal Generator 200, Bridge Driver 300 and Error Detector 500. The INDX signal also provides a STEP command at terminal 616 to the Stepper Drive 700, which returns a commanded in-position signal POSN at terminal 618 to be used to generate an in-position signal (IPOS-DTFO) at terminal 677 to the computer.

The end-of-test signal EOT is transmitted back to the computer as DTF1 at terminal 675. The PASS signal from the Error Detector 500 is inputted at terminal 639 to be used in the EOT logic for leakage test and with read tolerance control pulse (RTOL - DCP2) at terminal 641 from the computer to provide counter enable signal CTRE at terminal 673 to Control Logic 100. The measured percentage error (tolerance) read signal (TRED - DTF3) at terminal 669 to the computer, as result of PASS and to tolerance counter overflow signal OFLO at terminals 639 and 612 respectively.

Also located in the Test Control 600, though not related to the timing function and thus may be located in one of the other subassemblies, is a digital to analog converter which receives the six bit binary tolerance signals (TOL 0 through 5) at terminals 601, 602, 604, 606, 608, 621 from Logic Control 100 and provides a DC voltage TOLP at terminal 609 to the Error Detector 500 proportional to the tolerance limits.

Another unrelated logic section of Test Control 600 uses data transfer function and pulse (DTIF and DTIP) at terminals 670 and 672 and data select function (DSF2) at terminal 631 to gate or transit the six bit word TOL 0 through 5, OFLO and ERRS inputted at terminals 601, 602, 604, 606, 608, 621, 612, 644 to output terminals 668, 666, 664, 658, 656, 652, 648, 646 to the computer as the eight bit data word DI 0 through 7. Since TOL 0 through 5 and OFLO are from Control Logic 100 and represent the measured percentage error (tolerance) and ERRS (error signal) is from Error Detector 500, this circuit could be located elsewhere.

The Stepper Drive 700 has a pitch command (PITCH) on terminal 715, from a panel pushbutton, 28 volt input power and ground on terminals 710, 711 and 712, 713, respectively, a step input (STEP) on terminal 728 from Test Control 600 and an inhibit signal (INH) from a panel pushbutton on terminal 717. The output from the Stepper Drive 700 is the four drive lines from terminals 702, 704, 706 and 708 to the Pitch Wheel Motor 800, and the inposition POSN signal from terminal 725 back to the Test Control circuit 600.

The detail circuitry and logic of the individual circuits of the test station electronics 45 are as follows:

CONTROL LOGIC 100

Figure 3A:
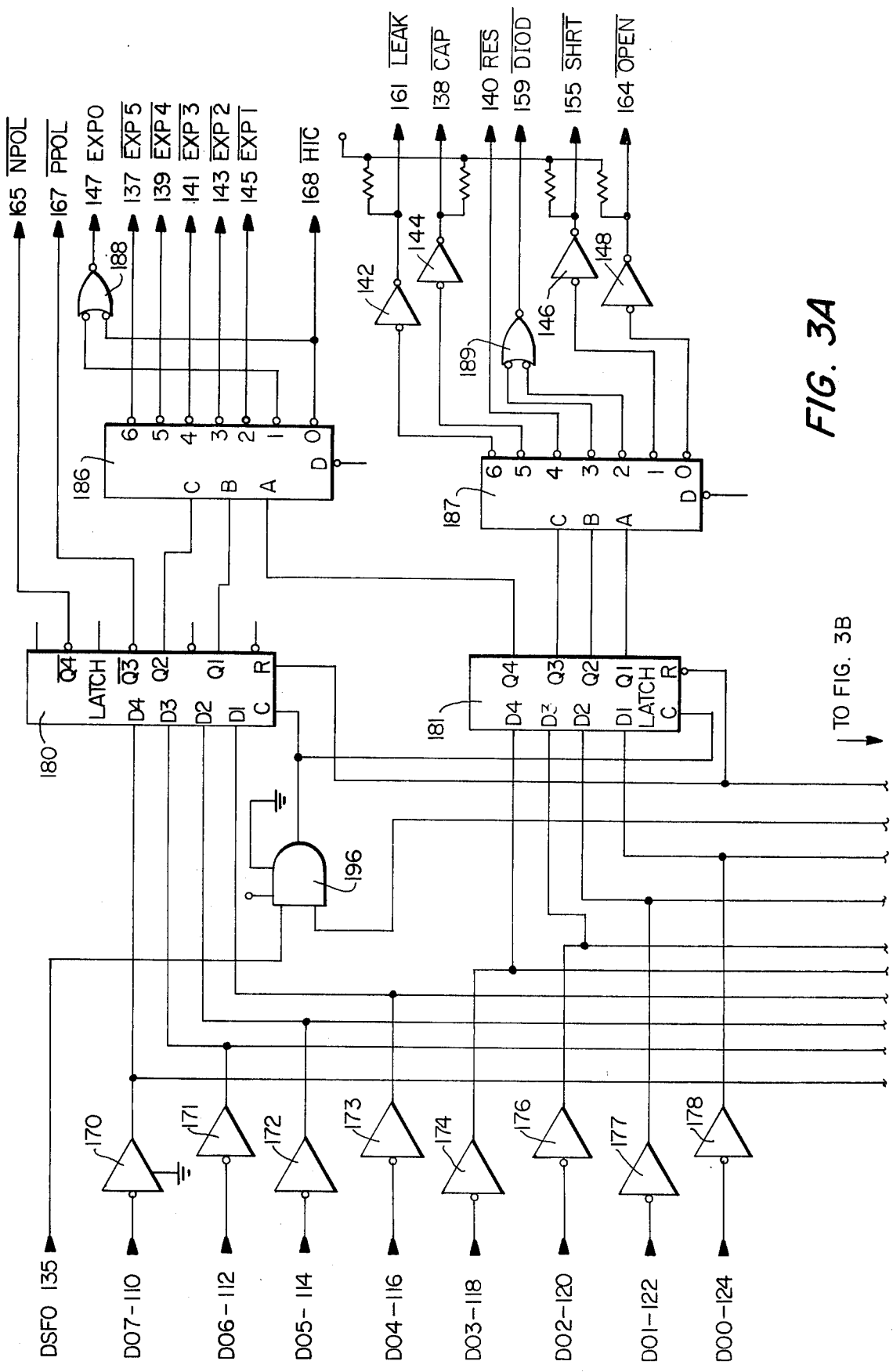
FIGS. 3 A and B are a schematic of the Control Logic.
Figure 3B:
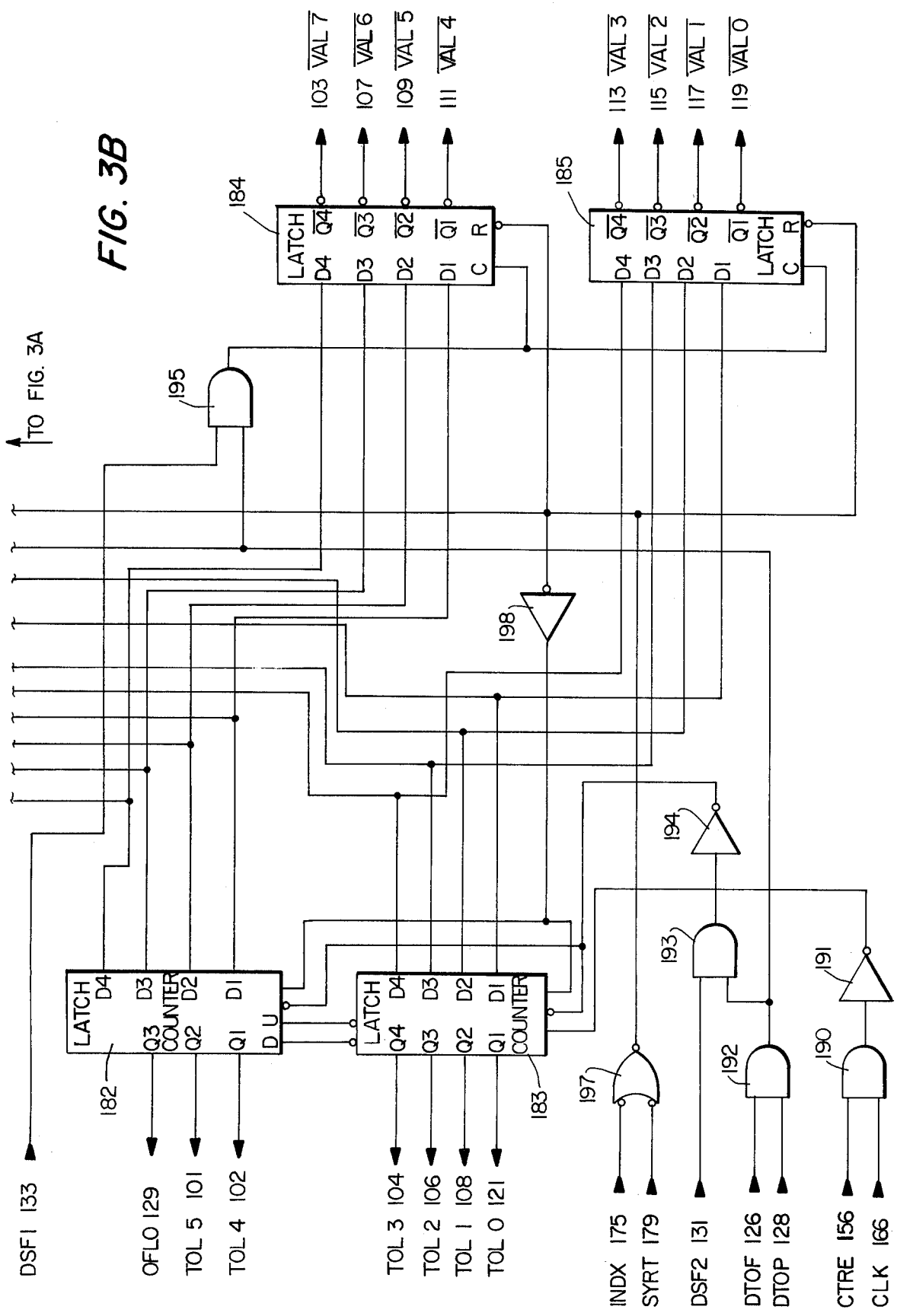

As illustrated in FIGS. 3A and 3B, the eight data lines from the computer (DO 0 through 7) are provided on inputs 124, 122, 120, 118, 116, 114, 112, 110 and through corresponding inverters 178, 177, 176, 174, 173, 172, 171, 170 to three pairs of latches (180 and 181, 182 and 183, and 184 and 185). The latches are controlled by logic using the data select functions (DSF0, DSF1, DSF2) appearing on terminals 135, 133 and 131 in conjunction with data transfer function and pulse signals (DTOF and DTOP) appearing at terminals 126 and 128 from the computer. These signals are combined by AND gate 192 to provide an input to AND gates 193, 195, and 196. AND gate 196 allows latch pair 180 and 181 to accept the eight bit word from inputs DO 0 through 7 and hold it for the decoders 186 and 187 to provide the required component type/exponent/polarity output signals. Similarly, AND gate 195 permits the latches 184 and 185 to accept the eight bit data signal and hold it for the value output signals VAL 0 through 7. AND gate 193 permits, via inverter 194, the latch/counters 182 and 183 to accept and hold the data required for the TOL 0 through 5 outputs.

The first eight bit data word from DO 0 through 7 is transmitted to latches 180 and 181. The upper two bits are used by latch 180 to provide a signal representing polarity if any of the component under test (NPOL and PPOL) at the output terminals 165 or 167 directly. The lower two bits of latch 180 and the upper bit of latch 181 are decoded by decoder 186 to assert one of the exponent lines (EXP 0 through 5) of the decode value of the component or the high capacitance signal (HIC) on output terminals 147, 145, 143, 141, 139, 137, and 168. Negative OR gate 188 asserts line 147 for either a decode of zero or one. The type of component test control signal LEAK, CAP, RES, DIOD, SHRT or OPEN, are provided on one of the output terminals 161, 138, 140, 159, 155, 164, from the lower three bits of latch 181 via decoder 187, negative OR gate 189 and buffers 142, 144, 146, 148. The second eight bit data word provides the value of the component (VAL 0 through 7) as an eight bit binary number on output terminals 119, 117, 115, 113, 111, 109, 107, 103 via the pair of latches 184 and 185. The third data word, using only six bits, provides the tolerance (TOL 0 through 5) as a binary number at terminals 121, 108, 106, 104, 102, 101, via latch/counter pair 182 and 183. Overflow (OFLO) at terminal 129 is used when 182, 183 are used as counters. The latches 180 through 185 are reset at power on by signal SYRT on terminal 179 and at the beginning of a test for a new component by data control pulse DCPO (INDX) at terminal 175 via negative OR gate 197 and inverter 198.

As will be explained more fully in the discussion of the Test Control circuit 600, the latch/counters 182 and 183 are also used in providing the actual measured percent error of the component under test. A Counter Enable signal (CTRE) at terminal 146 and a clock signal (CLK) at terminal 166 via AND gate 190 and inverter 191 drive latch/counters 182 and 183 in a counter mode. When enabled by CTRE, the latch/counters 182 and 183 are incremented by CLK pulses until the component under test passes. The outputs 121, 108, 106, 104, 102, 101 and overflow OFLO 129 then provide a binary number representing the actual measured percentage error of the component under test or out-of-range indication.

SIGNAL GENERATOR 200

The Signal Generator 200 uses the component value inputs VAL 0 through 7, the polarity inputs PPOL, NPOL and test control signals DIOD, LEAK, CAP and HIC from the Control Logic 100, the test timing signal TEST from the Test Control 600 and the error feedback signal EFBP from the Bridge-Amplifier 400 to provide three signals ACO, AC90, DAC to the Bridge Driver 300 and a reference signal AC to the Error Detector 500. An oscillator whose frequency is changed by asserting line HIC and a DC generator whose output is controlled by PPOL, NPOL provide input signals, along with feedback signal EFBP, to a pair of amplifiers through attenuators and a pair of plural input analog gates. The selection of the signal source or sources for each of the amplifiers is controlled by the active test control line on the analog gates. The output signals AC and AC90 are provided directly by the oscillator and the output signal ACO is from one of the amplifiers. The output of the other amplifier is attenuated as a function of a binary signal VAL 0 through 7 representing the two significant digits of the value of the component under test utilizing a multiplying digital to analog converter to provide output signal DAC.

Figure 4A:
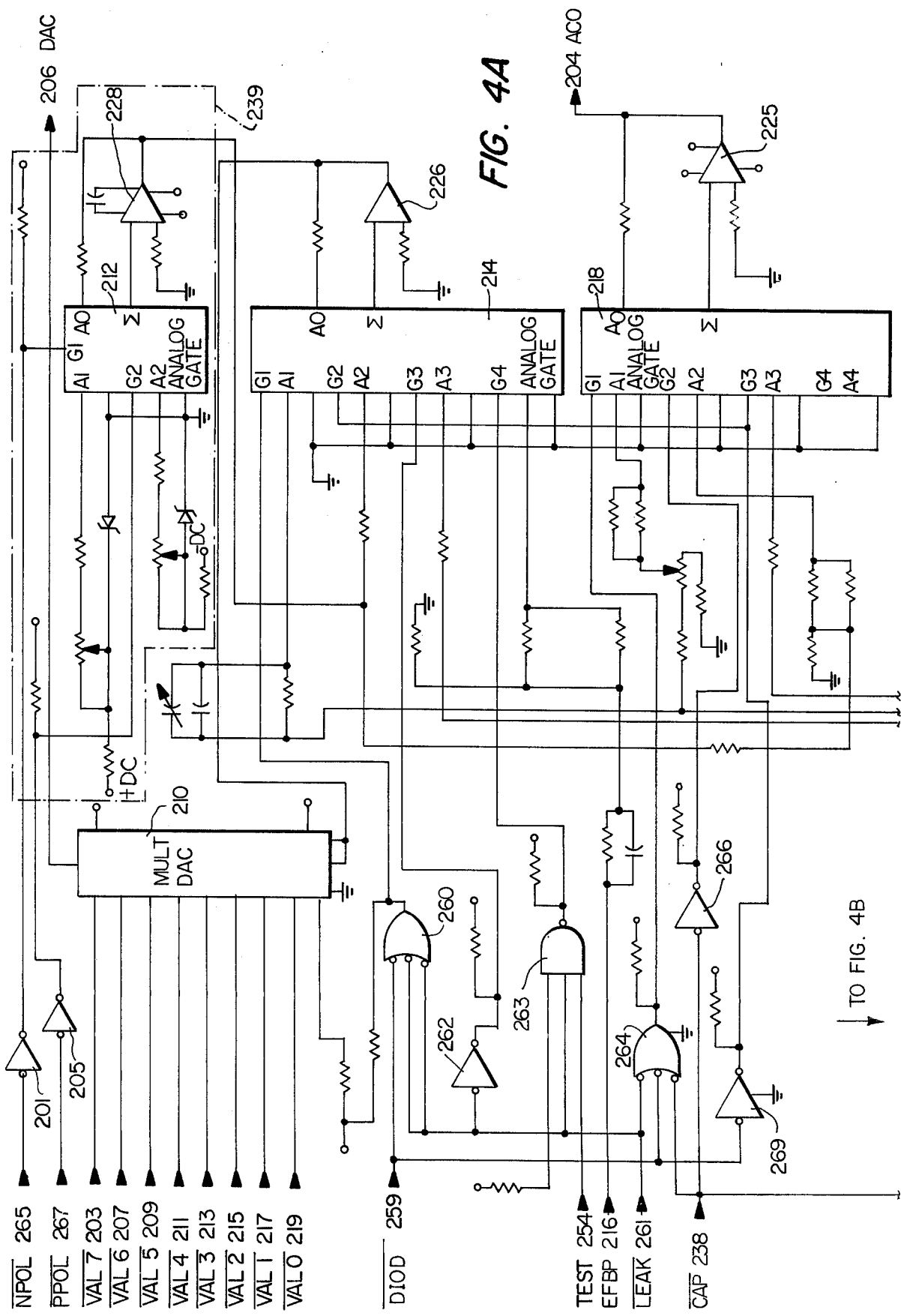
FIGS. 4 A and B are a schematic of the Signal Generator.
Figure 4B:
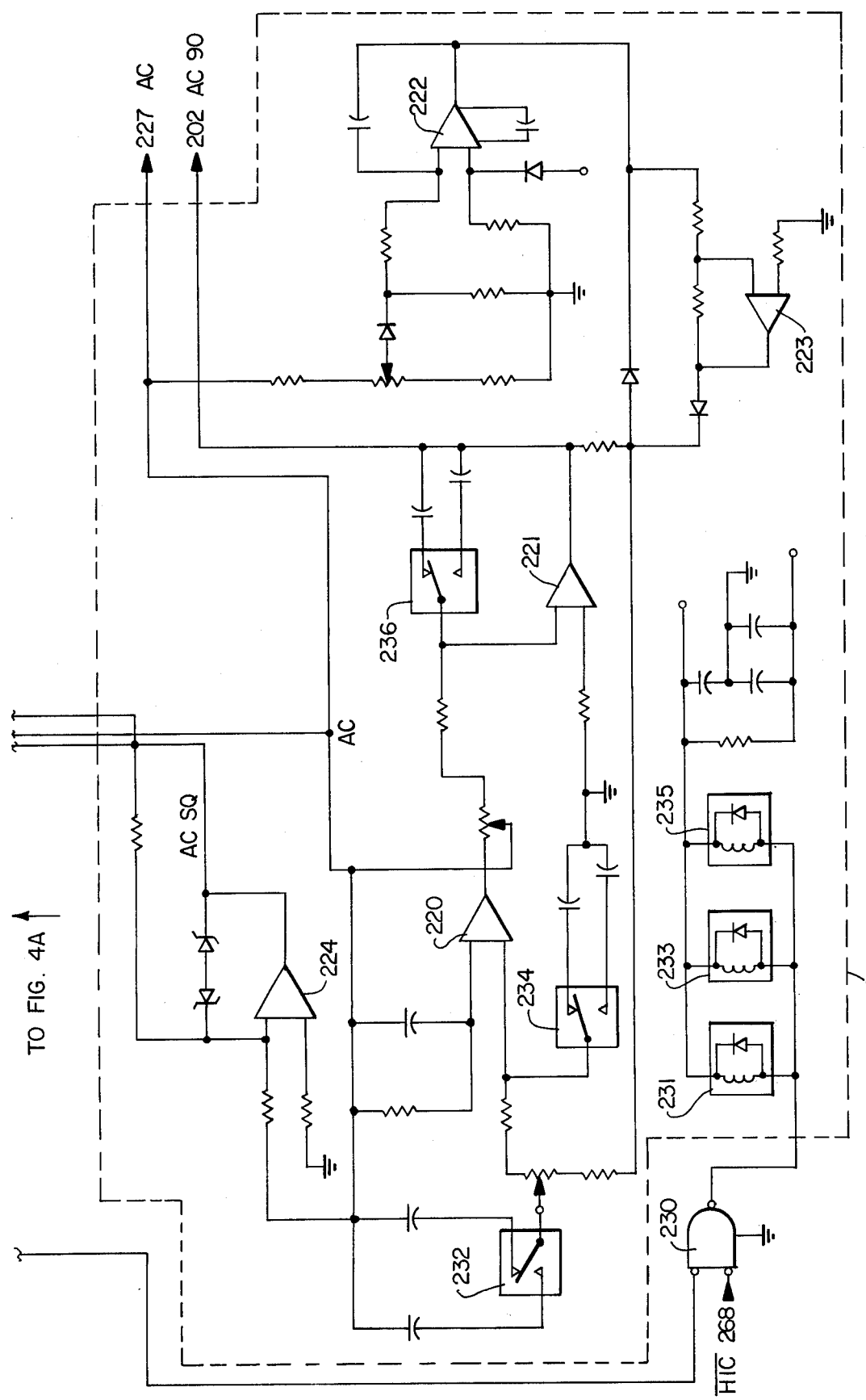

The logic of the Signal Generator 200, as shown in FIGS. 4A and 4B, will be explained hereafter while the detail function of the Signal Generator 200 for the individual types of test will be described in more detail in the discussion of the equivalent circuits for the types of test described in FIGS. 12 through 18.

The negative and positive polarity control signals NPOL and PPOL appearing at input terminals 265 and 267 are used via buffers 201 and 205 to control gates G1 and G2 respectively, of analog gate 212 of the DC generator 239 (enclosed in the dotted lines in FIG. 4A). A positive DC reference voltage is provided at input A1 and a negative DC reference voltage is provided at input A2 of analoge gate 212. Depending upon which, if either, command NPOL or PPOL is active, the respective gate G1 or G2 allows the selected DC voltage to pass through the inverting amplifier 228. This DC reference voltage (if any) from the DC generator 239, is applied to input A2 of analog gates 214 and 218.

The error feedback signal EFBP on terminal 216 from the Bridge-Amplifier 400, is supplied at input A4 of analog gate 214, and the remainder of the inputs of analog gates 214 and 218 are provided from the oscillator system 229 which is enclosed in the dotted lines in FIG. 4B.

The oscillator system 229 includes amplifiers 220 through 224 and associated resistor and capacitive elements in order to produce an amplitude and frequency stable reference AC signal having an O or reference phase (AC), a second AC reference signal having a 90° phase shift from the zero reference AC signal (AC90) and a flat topped AC signal (AC SQ). The amplifiers 220 and 221 form the basic oscillator with output AC90 at the output of the amplifier 221 and an output AC at the output of amplifier 220. Amplifiers 222 and 223 are connected as an integrating peak detector and an inverting amplifier respectively having as the input signal AC from terminal 227. The output of amplifiers 221 and 222 limit the amplitude of the feedback signal in the oscillator and thus provide amplitude control. Amplifier 224 whose input is connected to the output of amplifier 221 clips the top of the AC signal to provide the flat topped signal ACSQ.

The output of amplifier 220 is the signal AC which is provided at output terminal 227 and is the input to terminal A1 of both analog gates 214 and 218. The amplifier 221 provides the signal AC90 at output terminal 202. Amplifier 224 provides at its output the signal ACSQ which is an input to input A3 of analog gate 214 and to inputs A3 of analog gate 218. Switches 232, 234 and 236 select between two pairs of capacitors in the oscillator circuit of amplifiers 220 and 221. The switches 232, 234, 236 are controlled respectively by solenoids 231, 233, 235 which are activated by a signal from negative AND gate 230 whose inputs are CAP and HIC from terminals 238 and 268 respectively. By switching the capacitance values, the solenoid and switches consequently reduce the frequency of the oscillator by, for example, a factor of 10, when a high value of capacitance is to be tested.

It should be noted that the plurality of resistors provided between the inputs to analog gates 214 and 218 and the AC or DC source signals provides desired attenuation. The amount and type of attenuation will become evident in a detailed description of the equivalent circuits for the particular device being tested in the discussion of FIGS. 12 through 18.

The gates of the analog switches 214 and 218 are controlled by the type of test control signals appearing on terminals 259, 261 and 238, and the test timing signal on terminal 254 from the Test Control 600. Gate G1 of analog gate 214 is controlled by NAND gate 260 (operating as a negative NOR gate) whose inputs are DIOD and LEAK. Gate G2 of analog gate 214 and gates G3 and G4 of analog gates 218 are controlled through buffer 269 by the DIOD input signal. Gate G3 of analog gate 214 is controlled by buffer 262 whose input is LEAK, and gate G4 of analog gate 214 is controlled by NAND gate 263 whose inputs are TEST and LEAK. Gate G1 of analog gate 218 is controlled by the negative NOR gate 264 whose inputs are LEAK, DIOD and CAP. Gate G2 of analog gate 218 is controlled by buffer 266 whose input is CAP. The operation of amplifiers 225 and 226 with inputs via analog gates 218 and 214, respectively, as produced by the aforementioned logic, will become clear when considering the equivalent circuits for the type of test.

Figure 10:
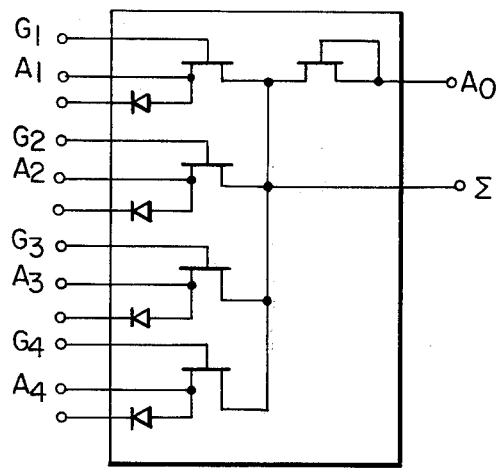
FIG. 10 is a schematic of an analog gate.

The output of amplifier 225, indicated on terminal 204 as AC O, is used in the Bridge Driver 300. The output from amplifier 226 is used as the dynamic input to the multiplying Digital-to-Analog Converter (DAC) 210. The digital input to the DAC 210 is the binary number represented by VAL 0 through 7 from terminals 219, 217, 215, 213, 211, 209, 207, 203. The output from DAC 210 is thus a dynamic signal scaled by the digital input and is provided at terminal 206 as DAC for use in Bridge Drive circuit 300. A typical analog gate is illustrated in FIG. 10.

BRIDGE DRIVER 300

Bridge Driver 300 uses ACO, AC90 and DAC inputs from the Signal Generator 200, the type of test and polarity, from Control Logic 100, the Test signal from the Test Control 600 and the feedback signal EFBP from the Bridge-Amplifier 400 to produce bridge drive signals. The input signals ACO, AC90, DAC and EFBP are selected as a function of type of test, transmitted through a plurality of analog gates to a pair of power amplifiers. One of the amplifiers provides one bridge drive signal BDRN directly and the other amplifier provides the bridge drive signal BDRP either directly or via a step-up transformer, a rectifier, and a polarity switch. The circuit of the second amplifier is controlled by the type of test and polarity control signals.

Figure 5A:
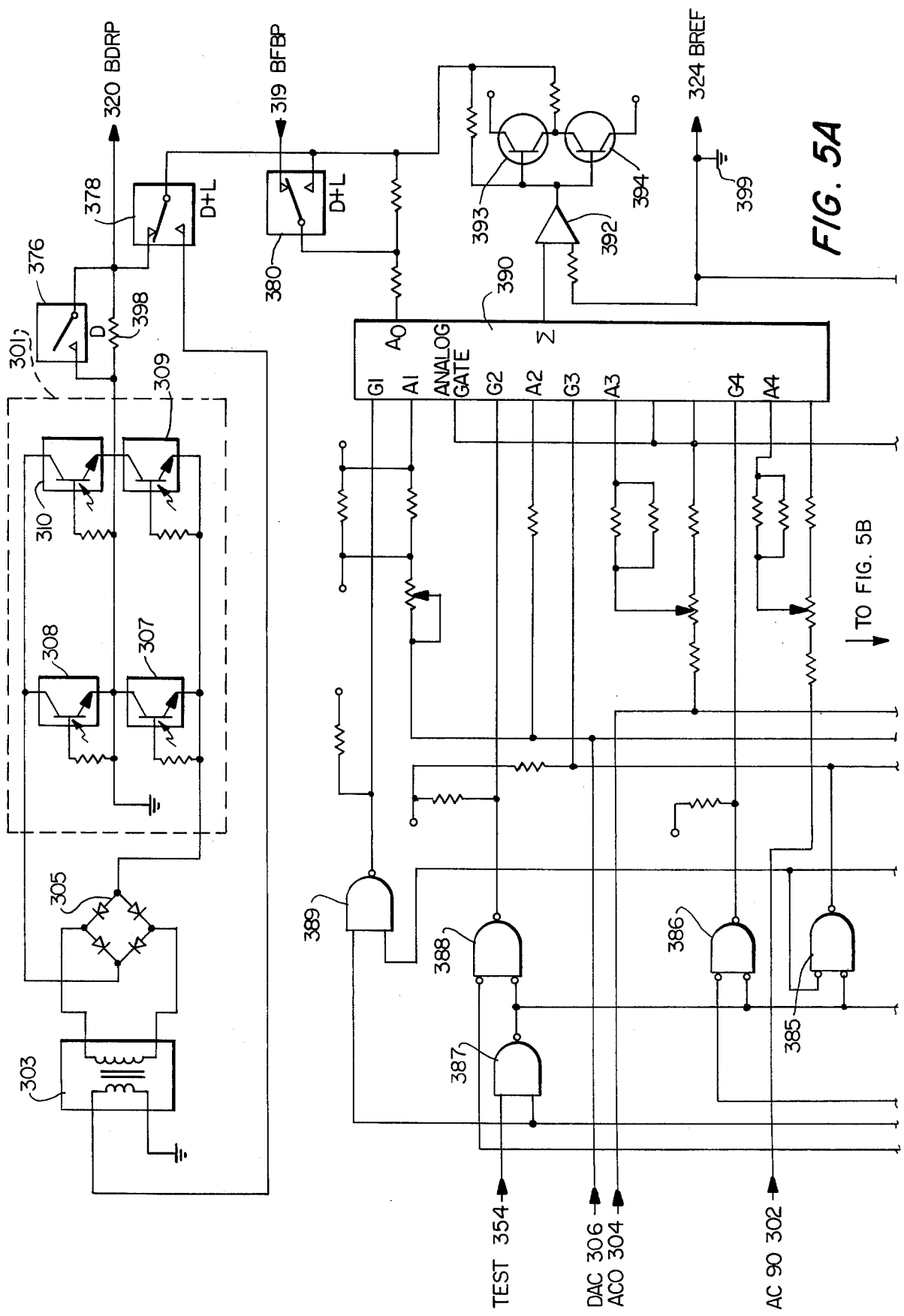
FIGS. 5 A and B are a schematic of the Bridge Driver.
Figure 5B:
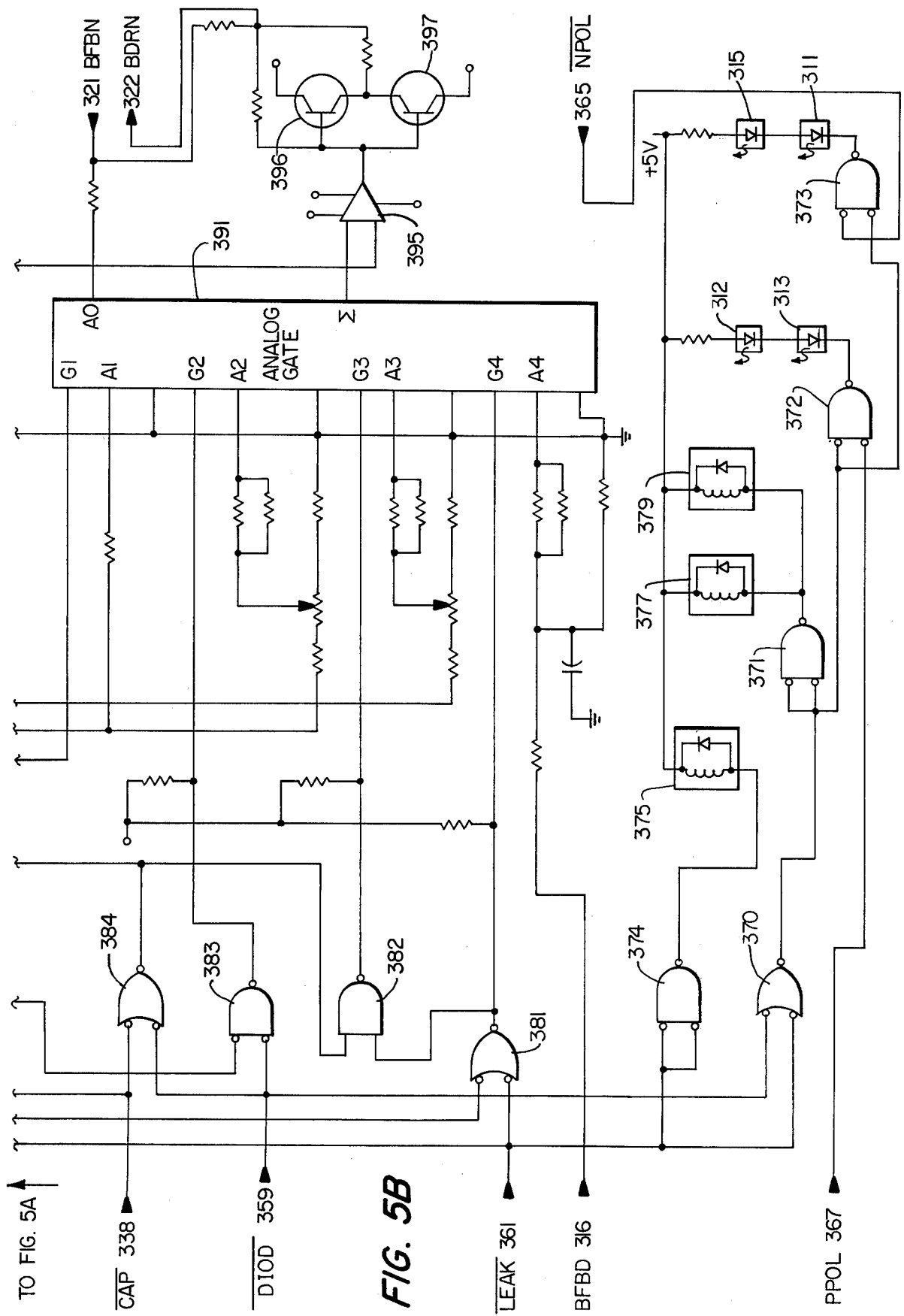

As illustrated in FIGS. 5A and 5B, the negative bridge drive signal BDRN appearing at output terminal 322 is produced by amplifier 395 and transistors 396 and 397 through analog gate 391. The bridge reference signal BREF at terminal 324 is ground reference 399 for amplifiers 392 and 395. The terminal AO of analog gate 391 is fed the bridge feedback signal BFBN from terminal 321 which is tied to the output signal BDRN at the Bridge-Amplifier 400. The signal DAC on input terminal 306 is applied to inputs A1 and A2 of analog gate 391, and signal ACO at terminal 304 is provided at input A3 of analog gate 391. The gates G1 through G4 of analog gate 391 are controlled by assertion of test signals CAP, LEAK or DIOD at terminals 338, 361 and 359 from the Control Logic 100 and TEST command signal at terminal 354 from Test Control 600 via negative OR gates 381, 384, NAND gate 382, inverting NAND gate 387 and negative AND gate 383, 385. The resistors at the signal inputs A1 through A4 provide the required attenuation which is a function of circuit design and type of component test.

The inputs to analog gate 390 includes a signal DAC from terminal 306 to inputs A1 and A2, the input signal ACO from terminal 304 to input A3 and the input signal AC90 from terminal 302 to input A4. As noted, for analog gate 391, the resistors between the input terminals 302, 304 and 306 and the inputs A1, A2, A3 and A4 for analog gate 309 provides various amount of attenuation.

The gates G1 through G4 of analog gate 390 are controlled by assertion of test signals CAP, LEAK and DIOD at terminals 338, 361 and 359 from the Control Logic 100 and TEST command signal at terminal 354 from Test Control 600 via negative OR gate 384, NAND gate 389, inverting NAND gate 387 and negative AND gates 386, 388, 385.

Positive bridge drive signal BDRP at terminal 320 comes via switch 378 either directly from transistors 393 and 394 via amplifier 392 and analog gate 390, or from the same source, but diverted by switch 378, through step-up transformer 303, rectifier 305 and polarity switch 301. Also connected between the output of polarity switch 301 and the output terminal 320 is a resistor 398 which may be bypassed by switch 376. A switch 380 controls the feedback signal for amplifier 392. With switch 380 in the position shown in FIG. 5A, the output signal BDRP is fed back from the component under test via the Bridge-Amplifier 400 as the positive bridge feedback signal BFBP from terminal 319 to the amplifier 392 and power transistors 393 and 395 is fed back directly via feedback input AO of analog gate 390.

The switches 376, 378 and 380 are controlled by solenoids 375, 377 and 378 respectively shown in the lower portion of the circuit in FIG. 5B. Solenoid 375 is controlled by input control LEAK at terminal 361 through buffer negative AND gate 374. Solenoids 377 and 379 are controlled by signals LEAK or DIOD at terminals 316 and 359 respectively through negative OR gate 370 and negative AND gate 371, used as a power buffer.

The polarity switch 301 is composed of four opto-isolators consisting of photo transistors 307, 308, 309 and 310 and light emitting diodes 311, 312, 313, and 315. The light emitting diodes 311 and 315, in series, are controlled by negative AND gate 373 whose inputs are signal NPOL from terminal 365 and the output from negative OR gate 370. Light emitting diodes 312 and 313, also in series, are controlled by negative AND gate 372 whose inputs are signals PPOL from terminal 367 and the output of negative AND gate 370. The arrangement of the light emitting diodes allows one diagonal pair of photo transistors to conduct depending upon which pair of photo diodes is on and thus to provide a polarity switching function. Though the opto-isolators are used for the polarity switch 301, since they offer greater reliability than mechanical switching, obviously other types of polarity switches may be provided at the output of transformer 303 and rectifier 305.

BRIDGE-AMPLIFIER 400

Bridge-Amplifier 400 receives drive signals BDRP and BDRN from the Bridge Driver 300, and an exponent value and type of test from Control Logic 100 to construct a bridge and provide the appropriate drive signal for the component under test. The bridge drive signal BDRP is connected to one end of the component-under-test (CUT) and bridge drive signal BDRN is connected to one end of a resistance selected as a function of OPEN, SHORT or one of the exponent control signal EXP 0 through 5. These control signals in conjunction with the DIOD signal also determine the structure of the bridge circuit. Feedback signal BFBP, sensing the signal applied to the component under test, is returned via the Bridge-Amplifier 400 to the Bridge Driver 300. The input signal BDRN is immediately fed back to the Bridge Driver 300 as BFBN. Error Signals ERRP, EFBP and ERRN are generated in the amplifier section and fed to the Error Detector 500.

Figure 6A:
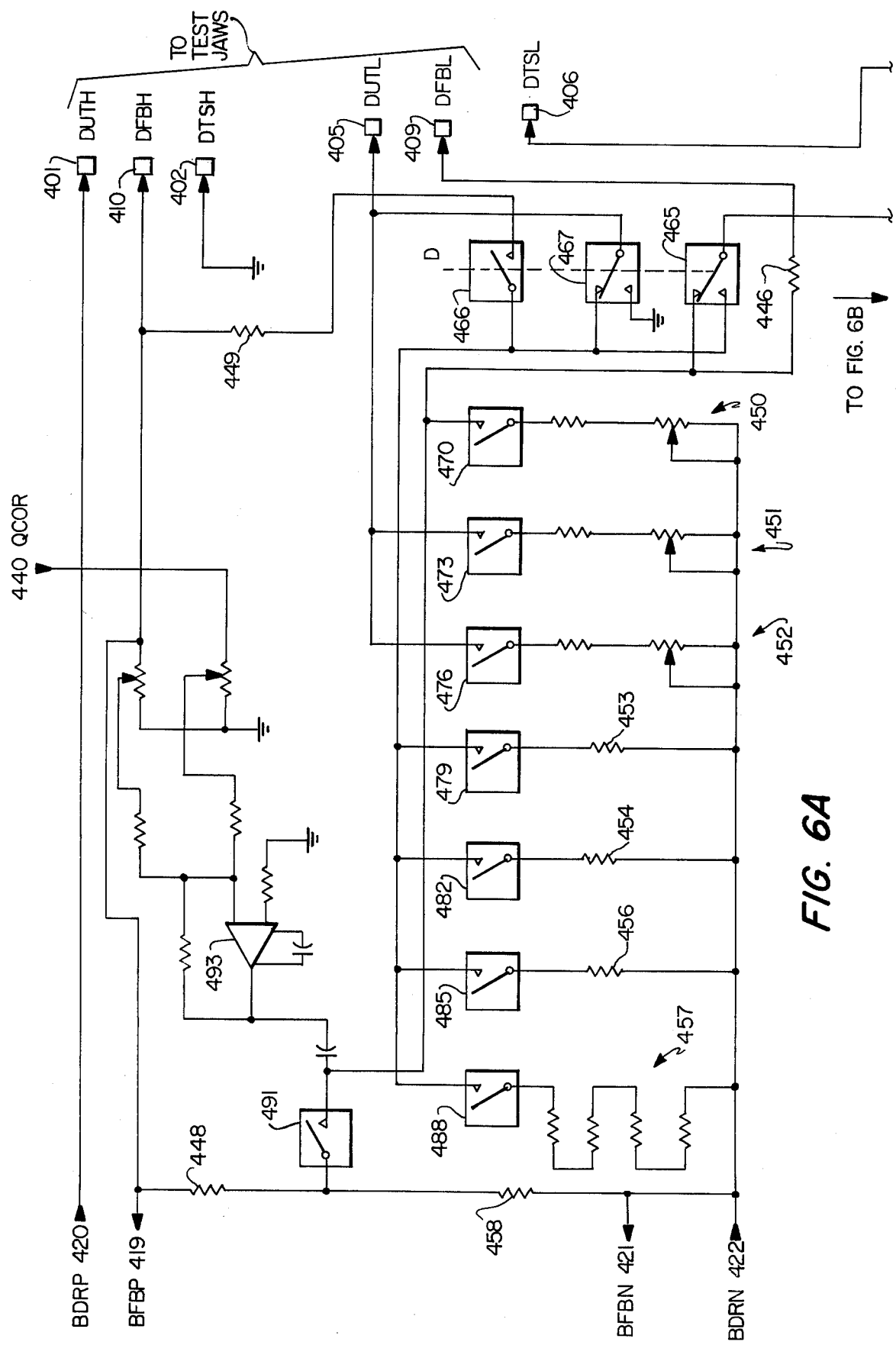
FIGS. 6 A and B are a schematic of the Bridge-Amplifier.
Figure 6B:
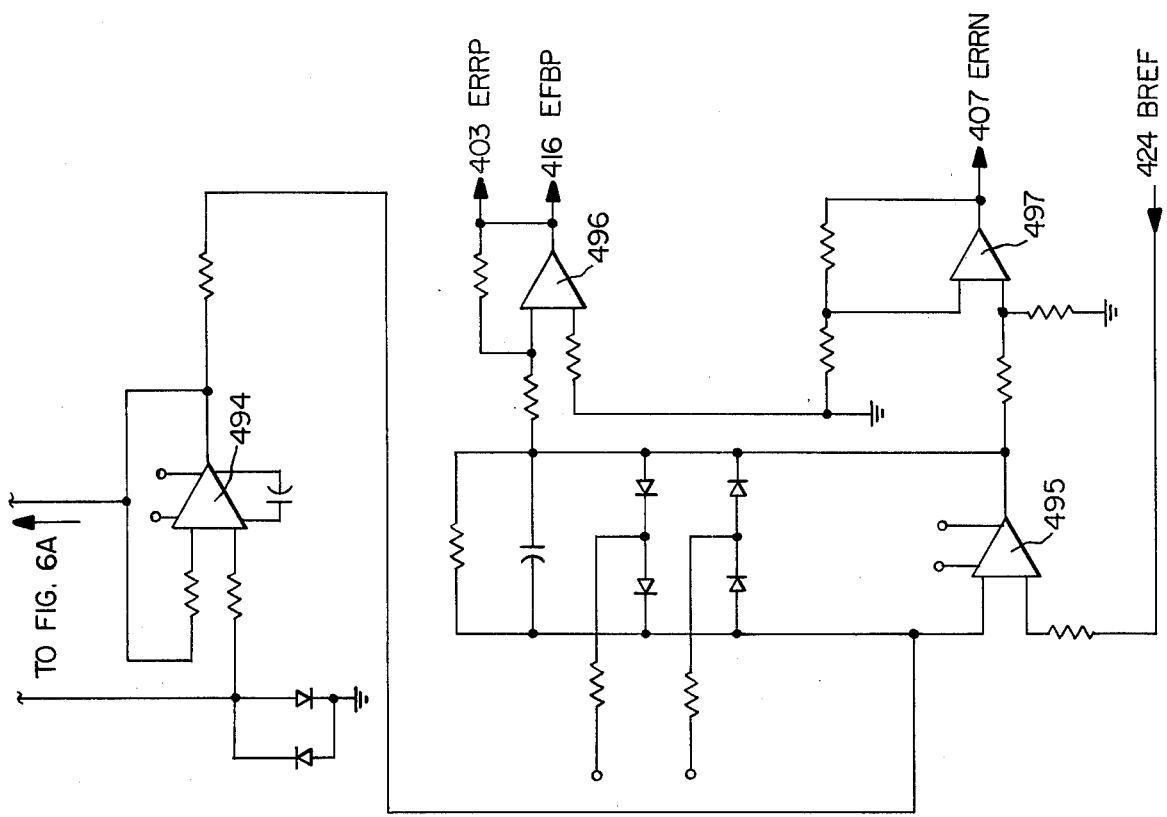
Figure 6B:
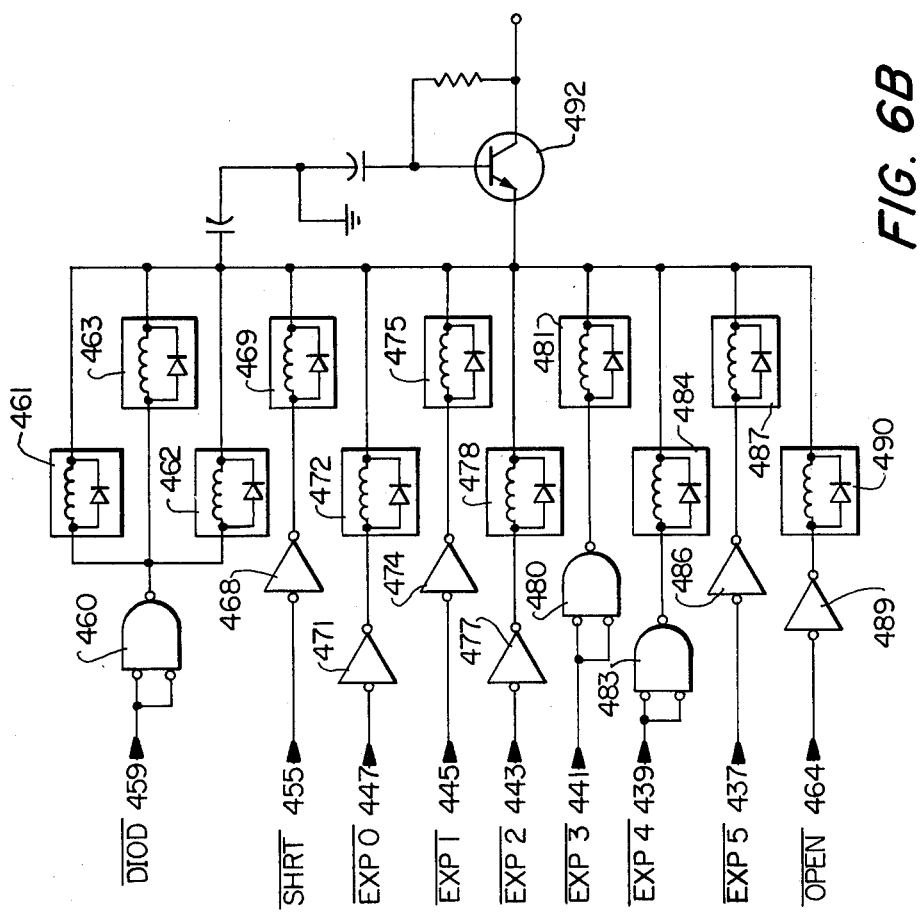

As illustrated in FIGS. 6A and 6B, the positive bridge drive signal BDRP at input terminal 420 is transmitted directly to the component under test (CUT) at output 401 of the Bridge-Amplifier circuit 400. The negative bridge drive signal BDRN at input terminal 422 is fed via one of a plurality of reference resistors and switch 467 to a common juncture point DUTL (405) with the low end of the component under test CUT (in most tests). Thus the CUT and one of the reference resistors form two arms of an asymmetric bridge, the juncture point between them, 405 being connected via 409 and switch 465 to the input of buffer amplifier 494. The reference resistors 451, 452, 453, 454, 456 and 457 provide a decade ladder selected by switches 473, 476, 479, 482, 485 or 488 respectively. A resistor 450 in combination with switch 470 provides a resistance value for the short test and resistor 448 in combination with switch 491 places a very large resistance value, for example one megohm, across the terminals of the CUT for the tests of an open.

Resistors 450, 451 and 452 are illustrated as comprising two resistors wherein one resistor is for precision adjustment. Resistor 457, though illustrated as comprising four separate resistors, may be a single resistor of an appropriate value. The first two exponent values resistors 451 and 452 are connected directly to the CUT via terminal 405. The remaining four exponent resistor values 453, 454, 456 and 457 are connected to the CUT through switch 467 and terminal 405.

A feedback signal from one side of the CUT at terminal 410 is transmitted directly back to the Bridge Driver circuit 300 as BFBP at terminal 419. The signal at terminal 410 is also combined with the signal at 421 via terminal 440 (QCOR) in a circuit including amplifier 493 and fed to the buffer amplifier 494 via switch 465. This circuit compensates for distributed capacitance of the test points and of the logic circuit. The switch 465 is connected to the input of amplifier 494, a high impedance buffer whos output, at unity gain, is used to neutralize distributed capacitance in the cable to the CUT via terminal 406. The output of amplifier 494 is also connected as an input to high gain differential amplifier 495 of limited output voltage swing whose reference input is BREF from terminal 424, the ground reference where signals BDRP and BDRN are generated. Connected to the output of amplifier 495 are a pair of amplifiers 496 and 497 which form a phase splitter producing positive and negative error signals ERRP and ERRN at terminals 403 and 407. ERRP is also designated a bridge error feedback signal EFBP at terminal 416. Error signals EERP and EERN are transmitted to the Error Detector circuit 500 and the error feedback signal EFBP is transmitted back to the Bridge Drive circuit 300.

For diode and zener diode tests switches 465, 466 and 467 are in a position opposite of that shown in FIG. 6A. In such a configuration, switch 467 connects one side of the CUT through terminal 405 to ground. The signal from the other side of the CUT, through terminal 410, is connected by resistors 449 and switch 466 to an appropriate selected resistor from the decade ladder, the junction being an input to switch 465. The net signal at this junction is provided as the input to amplifier 494 in lieu of the normal input from terminal 409. A DIOD command signal at terminal 459 through negative AND gate 460 activates solenoids 461, 462 and 463 which control the operation of switches 465, 466 and 467 respectively.

When testing for a short, signal SHRT is provided at terminal 455 which controls solenoid 469 through buffer 468 to activate switch 470.

One of the exponent values EXP 0 through 5, is provided as an input on terminals 447, 445, 443, 441, 439, or 437 respectively, and will activate solenoids 472, 475, 478, 481, 484, or 487 through buffers (or negative AND gates used as buffers) 471, 474, 477, 480, 483, 486 so as to close the appropriate switch 473, 476, 479, 482, 485, 488 respectively.

An open test is performed by providing signal OPEN at terminal 464 to activate solenoid 490 through buffer 489 to close switch 491. The actual construction of the bridge will be explained more fully in the description of the individual test illustrated in FIGS. 12 through 18.

ERROR DETECTOR 500

The Error Detector 500 uses the error signals ERRP and ERRN from the Bridge-Amplifier 400 with the type of test control signals from the Control Logic 100 and a tolerance level TOLP and control information from Test Control 600 to indicate the acceptance or rejection (pass, no pass) of the CUT and designate the sign of the error.

Figure 7A:
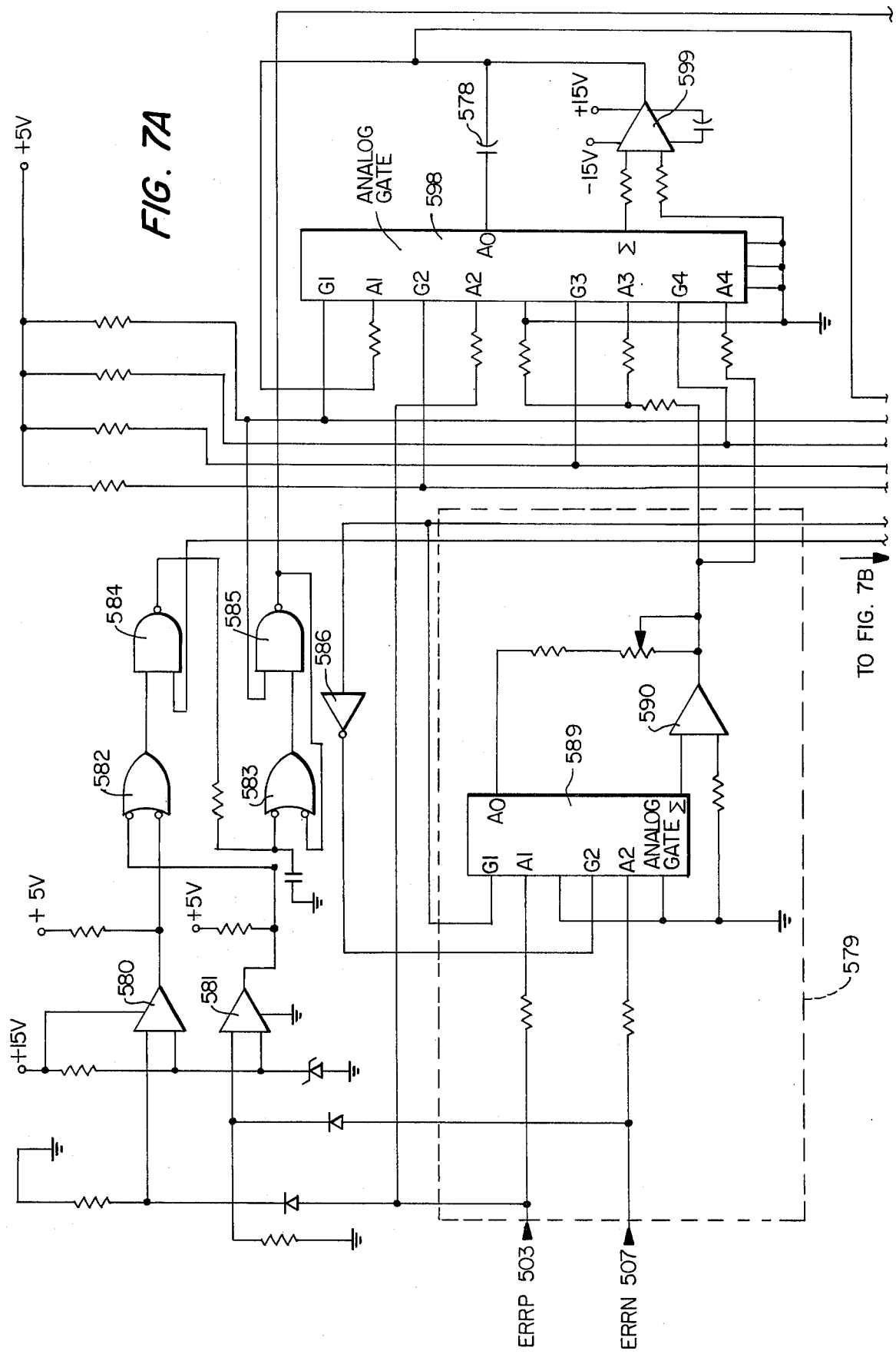
FIGS. 7 A and B are a schematic of the Error Detector.
Figure 7B:
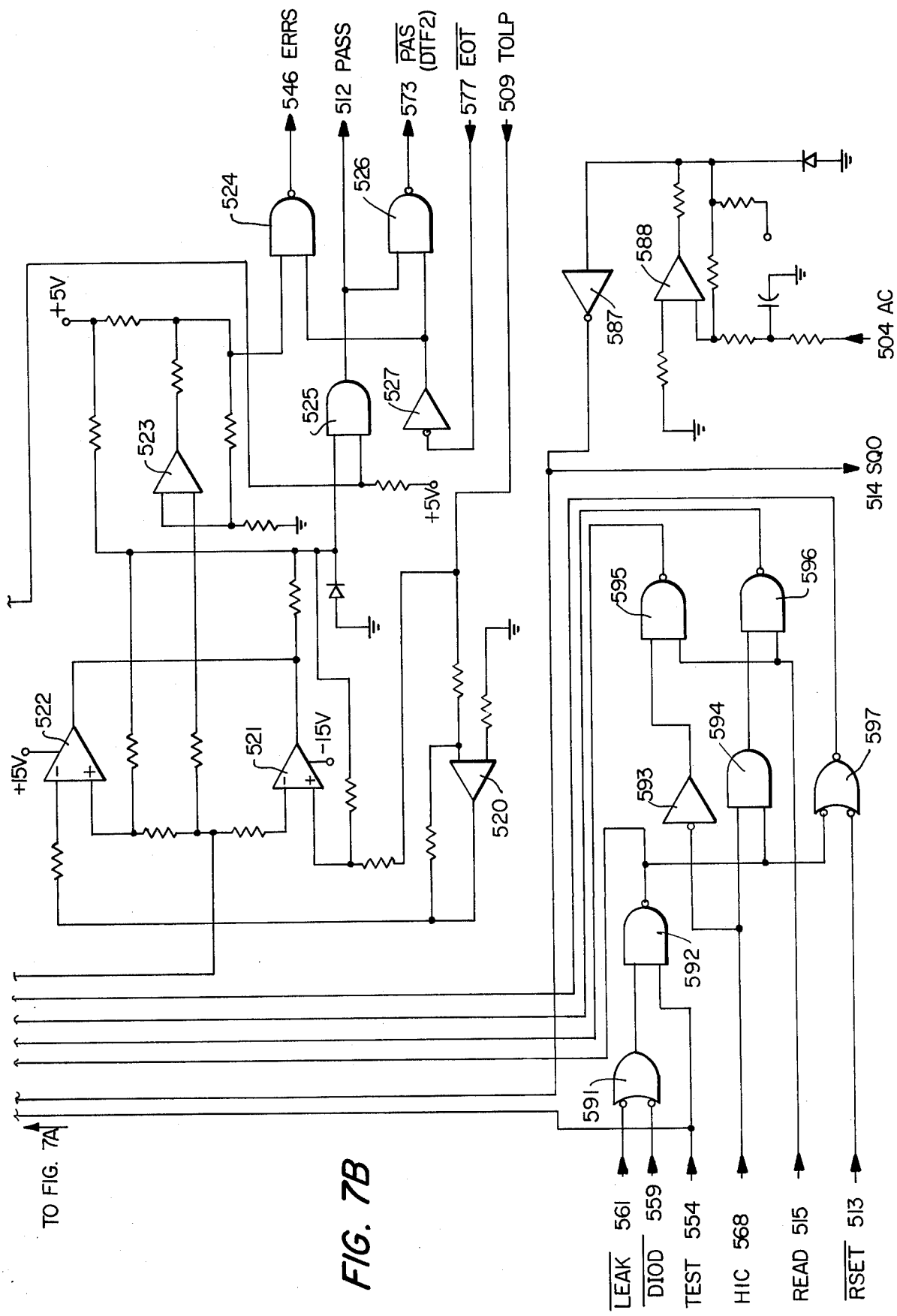

The input signals ERRP and ERRN on terminals 503 and 507, as illustrated in FIG. 7A, are fed directly into a synchronous rectifier 579 shown in the dotted lines. These signals are connected as inputs A1 and A2 of analog gate 589. The gating signals for gates G1 and G2 of analog gate 589 are square waves of opposite phase. G1 and G2 are in phase agreement with ERRP and ERRN respectively for one sense of the error determined in the Bridge circuit and in phase opposition with ERRP and ERRN respectively for the opposite sensed error. This gating causes amplifier 590 to produce a positive or negative full wave rectified signal determined by the sense (polarity) of the error.

The full wave rectified signal from synchronous rectifier 590 and 589 is then passed via input A3 or A4 of analog gate 598 to amplifier 599 operating as an integrator with capacitor 578 as the feedback element. The scaling of the integrator is such that the integrated output equals the peak value of the input error signal at the end of the allotted test period. Input A3 of analog gate 598 is controlled via gate input G3 which is controlled by logic gates 591, 592, 593, 594, 595 and 596 to be operative during the timing interval READ (input 515) for all tests excepting LEAK, DIOD or HIC at terminals 561, 559, 568. Input A4 is active under the same conditions excepting HIC must be present. Integrator 599 is reset just prior to each test by resistive feedback at A1 of analog gate 598 being turned on via negative OR gate 597 using inputs RSET at terminal 513.

The gating signals at G1 and G2 are generated from the AC reference signal AC at terminal 504, generated in the Signal Generator 200, via a phase shift network comparator 588, operating as a squaring amplifier, inverter 587 and gate controlling logic comprised of gates 582 through 586. The output of inverter 587 is provided as a square wave signal SQO at terminal 514 for use in Test Control 600 as a timing reference signal.

The gate controlling logic is also fed signals from comparators 580 and 581. These serve to sense if the error input ERRN and ERRP are saturated signals signifying that the CUT is out of range of error measurement. If such is the case, the signals from comparators 580 and 581 override the normal phase information and trigger a latch circuit comprised of gates 583 and 585 via gate 582 and 584 forcing a fail signal (inhibiting a pass signal) via gate 525. Were this circuit not used, the erroneous substitution of a capacitor in place of a resistor for the component under test or visa versa, can cause a net zero error from integrator 590 and thus generate a pass signal rather than a no-pass.

Amplifer 599 is used as, a gain of one, inverting amplifier during leakage and diode tests. In these cases the error signal ERRP 503 bypasses the synchronous rectifier and is inputted at A2 of analog gate 598 under control G2 of that device in response of LEAK or DIOD inputs 561, 559, via logic elements 591 and 592.

The output of error integrator amplifier 599 is connected to the plus side of comparator 522 and to the negative side of comparator 521. The plus input to comparator 521 is the tolerance signal TOLP from terminal 509 which is received from the Test Control circuit 600. The TOLP signal is also inverted through amplifier 520 and applied as the negative input of comparator 522. The comparator or differential amplifiers 521 and 522 provide a window detector to sense that the error signal does not exceed in magnitude the tolerance signals TOLP. Comparator 523, using the output of amplifier 599 and ground inputs provides the sign or polarity of the error signal. The output of comparators 521 and 522 are tied together to give a logical AND condition and connected to AND gate 525 operating as buffer to provide signal PASS at output terminal 512 directly or $\overline{PAS}$ (DTF2) at terminal 573 gate with the EOT signal at NAND gate 526. The sign of the error signal ERRS is provided at terminal 546 from comparator 523 through NAND gate 524. The other input to NAND gates 524 and 526 is the end-of-test signal EOT from terminal 577 through inverter 527. The signals ERRS and PASS are provided to the Test Conrol circuit 600 while the $\overline{PAS}$ is a second data test function DTF2 provided back to the computer to indicate that the component has passed the test.

TEST CONTROL 600

Figure 8A:
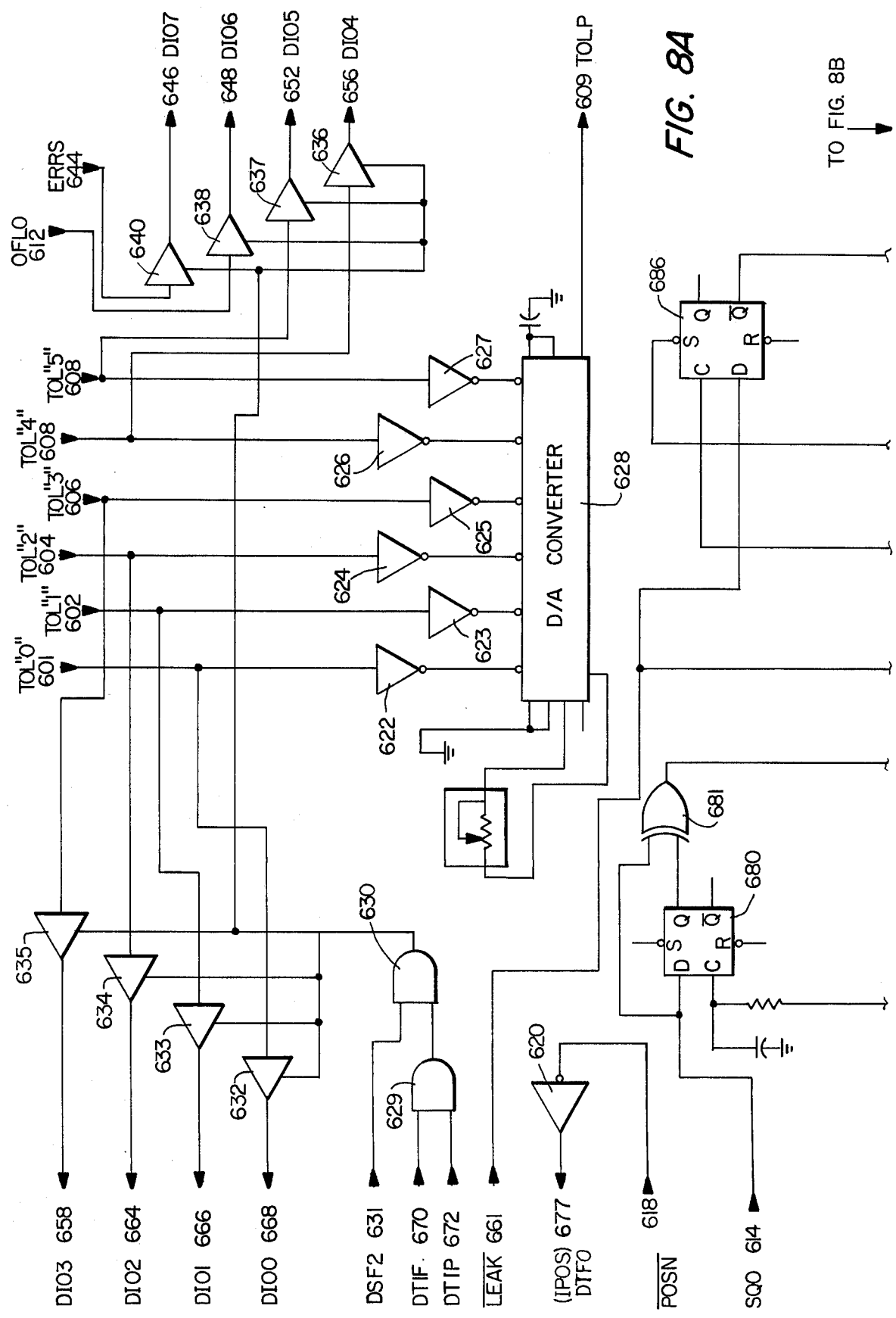
FIGS. 8 A and B are a schematic of the Test Control.
Figure 8B:
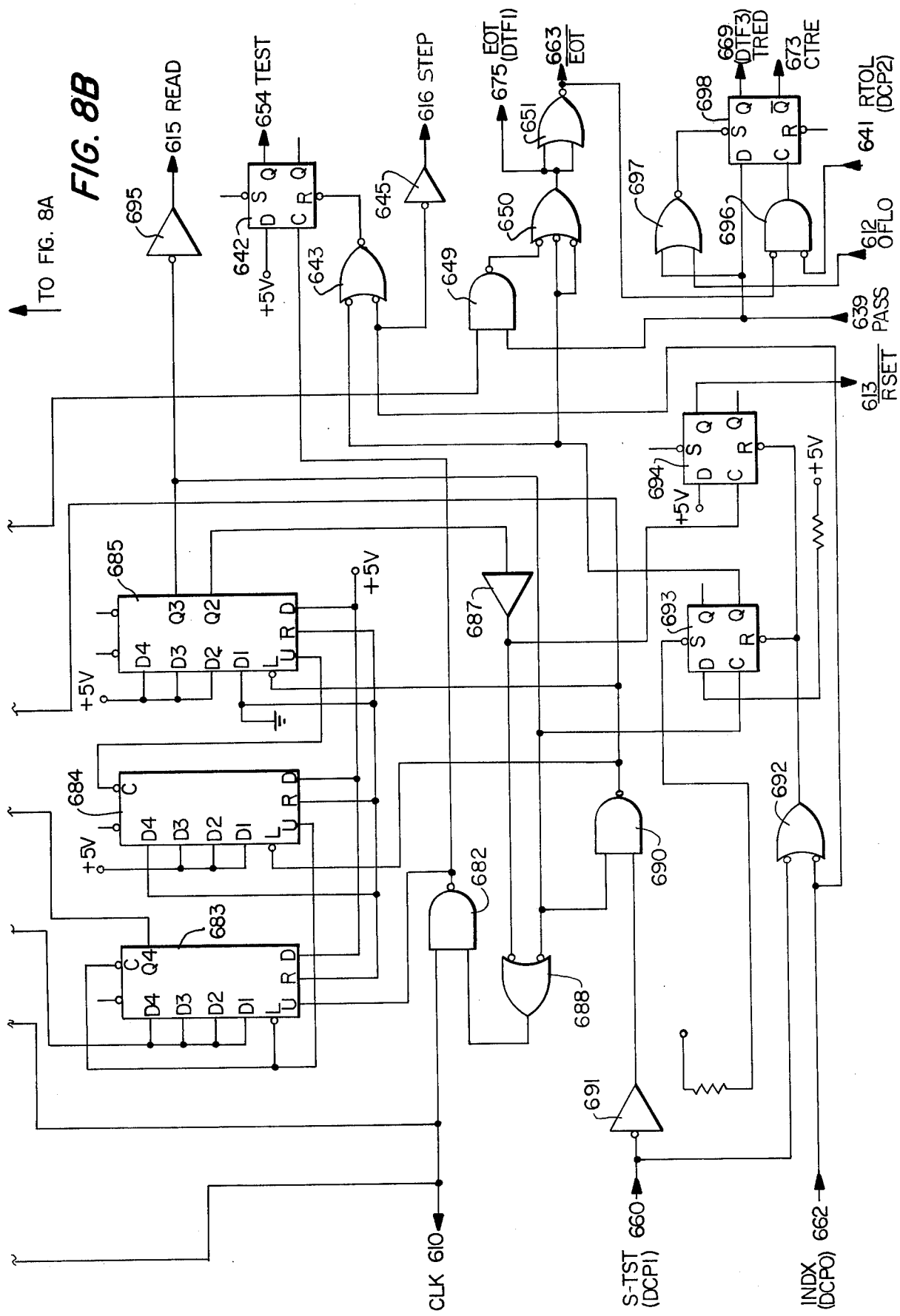

The Test Control, illustrated in FIGS. 8A and 8B, circuit has as its primary function the generation of the various timing signals necessary for operation of the Test Station Electronics. A timing pulse CLK is generated for use in the Test Control 600 and Logic Control 100, by using the square wave timing reference signal SQO at terminal 614 which is generated in Error Detector 500 using signal AC (the prime measurement reference signal generated in Signal Generator 200). The signal SQO is provided at the data input D of flip-flop 680 and at the input to exclusive OR gate 681 whose other input is the Q output of flip-flop 680. The output of exclusive OR gate 681 is high only when the input and output of flip-flop 680 are not in logic agreement. This output is coupled back to the clock input of flip-flop 680 so as to cause its output to change state to match its input. In this way a timing pulse CLK is generated at both axis crossovers of the original signal AC, and is used in Test Control 600 to generate timing signal and provided at terminal 610 for use by the measured percentage error counters in Logic Control 100.

When a start test signal STST is received from the computer (DCP1) at terminal 660, it is passed through inverter 691 and gate 690 to load into counters 684 and 685 via terminal L, a binary number representing a count of −24 (i.e. 11100111) and to preset flip-flop 686. As soon as this preset condition is received, output Q2 of counter 685 goes high and passes through inverter 687 and OR gate 688 to enable the clock pulse 610 to pass through gate 682 and start the counting operation of counters 684 and 685. The initial count pulse from gate 682 is provided to the clock input C of flip-flop 642 which causes the Q output to go high. This is the signal TEST provided at terminal 654 to initiate test measurements to be made by enabling appropriate gates on the Bridge Driver 300.

The clock pulse from gate 682, also enters terminal U of counter 683. In the general case when input LEAK at terminal 661 is not active (i.e., exception for leakage tests) counter 683 is preset to −1. As the count pulse enters an up count at terminal U, and the counter counts to zero, a carry pulse is outputted at C. This pulse immediately re-enters the counter at L loading a −1 via data inputs $D_1 - D_4$. Thus counter 683 is effectively not in circuit! During leakage tests, the LEAK input at terminal 661 causes a zero to be preset into the counter so that sixteen clock pulses are required before a carry pulse is generated. In either case, the carry pulse then enters counter 684 at terminal U, which in turn is connected to counter 685. When counters 684 and 685 count up from −24 to zero, output Q3 of counter 685 goes low. This output passes via inverter 695 to the READ terminal 615 from which it goes to the Error Detector 500 to enable the error integrator. At this time, the Q2 output of counter 685 also goes low. This signal, inverted via 687, also serves to trigger flip-flop 694 to turn "off" signal RSET at terminal 613 which when "on" inhibits the integrator of Error Detector 500. As counters 684 and 685 continue counting up to a count of +64, output of Q3 of counter 685 again goes high. This terminates the integration period via the READ output 615.

The combination of the Q3 output and the inverted Q2 output (via 687) inhibits further counting by the output of negative OR gate 688 preventing further clock pulses from passing through gate 682. As the Q3 output of 685 goes high, it also triggers flip-flop 693 causing its $\overline{Q}$ output to go low. This signal in turn passes through OR gate 643 to reset flip-flop 642. This terminates the testing period. The $\overline{Q}$ output of 693 also passes via OR gate 650 to generate the end-of-test signal EOT at terminal 675 sent as DTF1 back to the computer and the $\overline{EOT}$ signal via inverting gate 651 at 633 to Error Detector 500 where it gates the output signals ERRS and $\overline{PAS}$. Flip-Flop 686, is used only during leakage tests, and is normally left in the set condition. The combination of the LEAK input from terminal 661 and the 0 to 1 transition of counter 683 puts flip-flop 686 into a reset condition. Its $\overline{Q}$ output is ANDed at gate 649 with the PASS signal from terminal 639 to permit an end-of-test signal EOT 675 to be generated as soon as the leakage test senses a within-tolerance measurement.

The read tolerance input RTOL at terminal 641 is received from the computer after a test has failed. This signal passes via gate 696 to the clock input C of flip-flop 698. In the failed test condition, the data input D of this flip-flop is low, coming via PASS terminal 639 from the Error Detector circuit 500. The flip-flop 698 thus is put into the reset condition so that the $\overline{Q}$ output is high enabling the counter enable signal CTRE 673, thus enabling the clock signal CLK at terminal 610 to pass to the latch/counters 182, 183 on Logic Control circuit 100 which then start counting up. As they count up, the number represented by the tolerance data word increases so that the acceptable measured percentage or window of the Error Detector 500 widens. When the window widens enough to let the measured percentage error (output of integrator 599) fall within its range, a pass signal is generated and appears at input terminal 639. In the event the maximum range of the window is reached with a Pass signal generated, the counter 182 will overlow activating input terminal 612 with a signal OFLO. Either the PASS or OFLO signals will then set flip-flop 698 at its input S via OR gate 697. The fact that the Q output of flip-flop 698 goes high is then read by the computer as a tolerance ready signal TRED (DTF3) at terminal 669.

At this time the computer addresses the modified tolerance data word in latch/counters 182 and 183 via inputs DSF 2, DTIF, DTIP at terminals 631, 670, 672 respectively and reads it on the data input lines D1 00 through DI 07, at terminals 668, 666, 664, 658, 656, 652, 648 and 646 via gate buffers 632 through 638, and 640. The last two bits of this data word DI 06 and 07 designate respectively that the pass condition was not reached within the range of the tolerance window (OFLO active), and the polarity of the error signal ERRS which are received from the Logic Control 100 and Error Detector 500 at terminals 612 and 644 respectively.

It should be noted that the logic 629, 630 and gates 632 through 638 and 640 may be provided in other circuits of the Test Station Electronic 45 and are located with Test Control 600 as a matter of convenience. Two other circuits which are located in Test Control 600, as a matter of convenience, are the acceptable level of measured percentage error signal generator for TOLP and the component-in-place inverter for POSN.

The acceptable level of measured percentage error signal generator uses the six bit binary word TOL 0 through 5, at terminals 601, 602, 604, 606, 608, and 621 from Logic Control 100 as inputs to a digital to analog converter (DAC) 628 through inverters 622, 623, 624, 625, 626 and 627 respectively. The output of the DAC 628 is provided as analog signal TOLP at terminal 609 to the Error Detector circuit 500 where it is compared with the actual measured percentage error of the CUT to determine if the CUT is within acceptable limits.

The component-in-place inverter for POSN indicates to the computer that the stepper motor has been commanded to step into its final position for advancing the next component into the test contacts. The INDX signal at terminal 662 (FIG. 8B) provides via inverter 645 a STEP command at terminal 616 to the Stepper Drive 700. After the Stepper Drive 700 has commanded the stepper motor to advance to the next component into the test contacts, it returns a commanded in-position signal POSN at terminal 618 (FIG. 8A) to be used to generate via inverter 620 an in-position signal IPOS at terminal 677 to the computer as DTFO.

STEPPER DRIVE ASSEMBLY 700

Figure 9A:
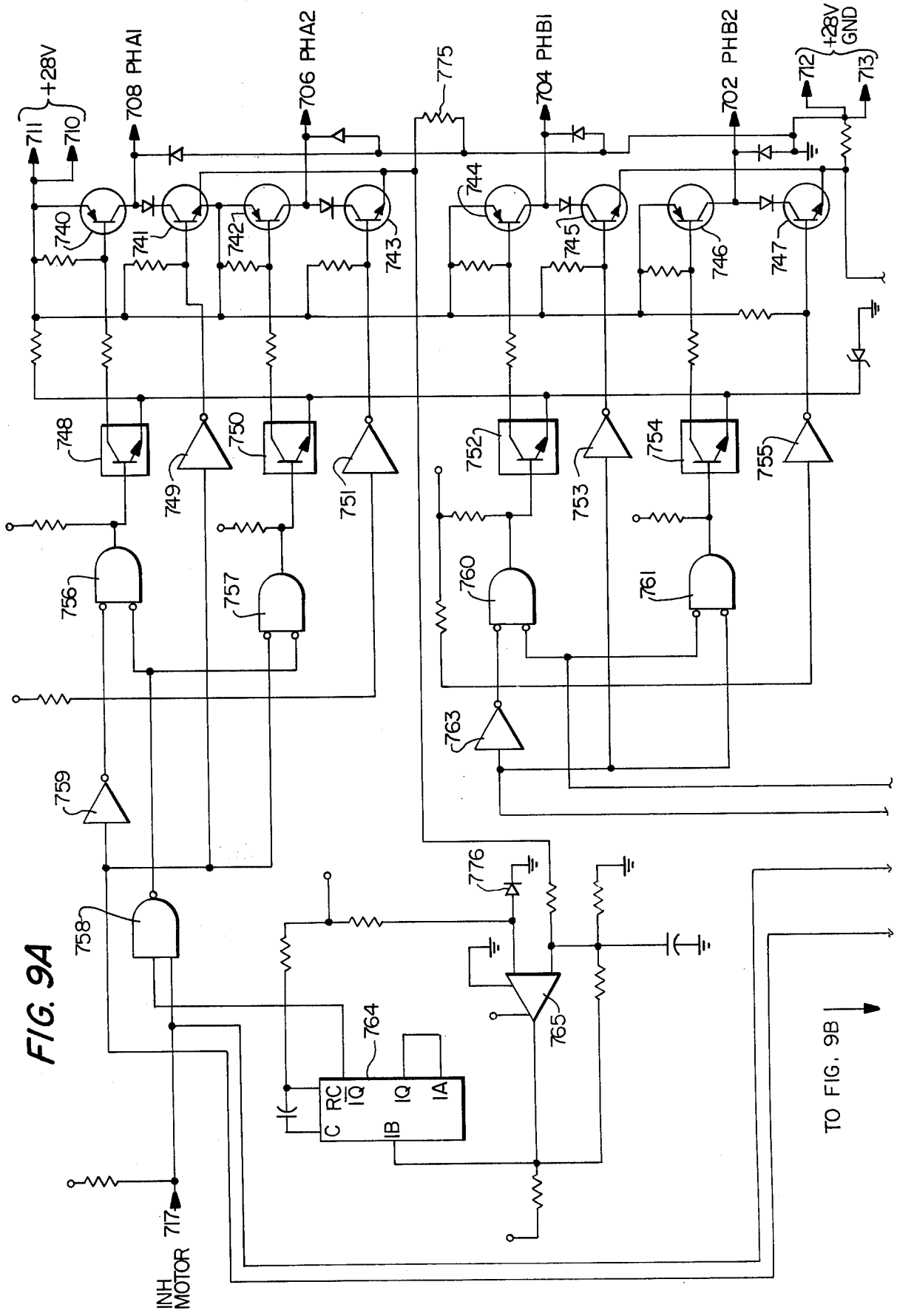
FIGS. 9 A and B are a schematic of the Stepper Drive.
Figure 9B:
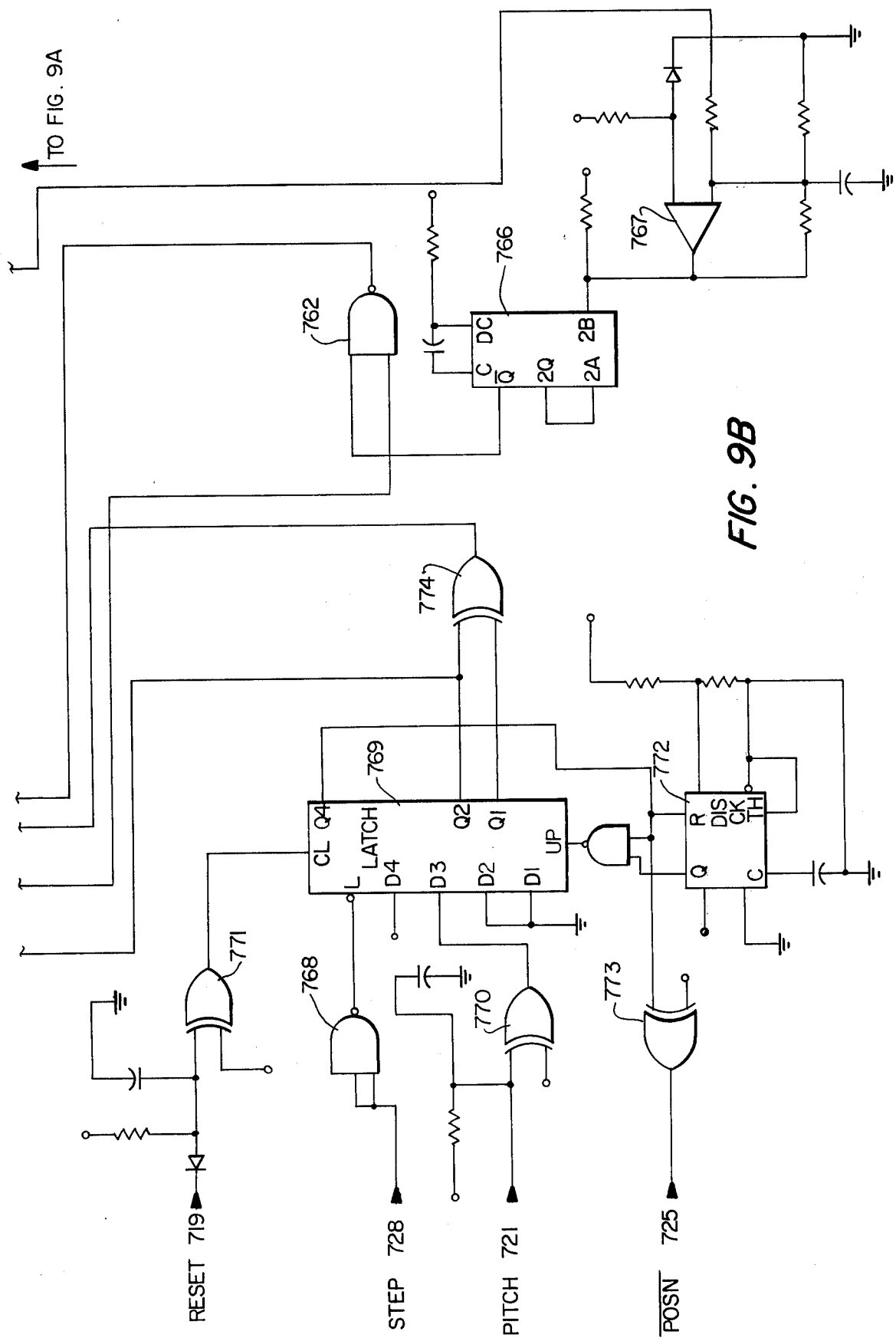

The Stepper Drive Assembly 700 as illustrated in FIGS. 9A and 9B, receives a step command as signal STEP from Test Control 600, and PITCH and motor inhibit (INH) signal from the Operator Control panel to drive the Pitch Wheel Motor 800. A transistor bridge having transistor 740 through 743 drives the outputs 708 and 706 and transistor bridges having transistors 744 through 747 drive outputs 714 and 702. The transistors 741 and 743 ae driven by invertors 749 and 751 respectively, in opposite logic states from a common input by virtue of invertor 759. Thus one of the transistors 741 or 743 is always on, but never both. Transistors 740 and 742 are driven by transistors 748 and 750 from the same inputs as transistors 743 and 741 respectively via negative NAND gates 756 and 757 (i.e., in reversed sense). Thus either transistor 740 or 742 may be on, but never both. The additional input to the gates 756 and 757 from NAND gate 758 serves to enable or disable drive to these transistors. NAND gate 758 has one input from terminal 717, controlled by a motor-inhibit button on the control panel manually inhibiting the drive of transistor 740 or 742. The second input to gate 758 is controlled from single shot multivibrator 764 which allows a timed pulse to be generated. Comparator 765 senses the current through transistors 741 and 743 via resistor 775 and compares this against a reference established by diode 776. When the current through 775 drops below the reference value, comparator 765 output a trigger which initiates a pulse by multivibrator 764 which turns on transistor 750 or 742 depending on the logic level state at the input to invertor 759. Thus the current level through the stepper motor winding connected to terminals 708 and 706 is maintained nearly constant and of a polarity determined by an input logic command.

Transistors 744 through 747 control a second motor winding via terminals 704 and 702 in exactly the same manner.

Motor operation is achieved in the standard means for stepping motors by alternately reversing the polarity of drive to one winding and then the other. This particular circuit is designed to cause the motor to step four times, or either, and then stop, depending on the status of the input PITCH 721. A circuit comprised of counter 769, pulse generator 772 and exclusive OR gate 774 generates the necessary drive (in the form of a burst of one or two cycles of square wave) to a pair of outputs which are in phase quadrature to each other.

This circuit utilizes the STEP signal at terminal 728 via NAND gate 768 operating as an invertor, to preset counter 769 to and initial condition via load input L and determind by the state of inputs D1, D2, D3 and D4. The PITCH input, terminal 721, determines whether D3 is loaded as a 1 or 0. When the count is loaded, Q4 output of counter 769 goes high enabling pulse generator 772 to operate and gating the pulse generator output Q to the counter input UP to cause the counter to count up from the preset value towards zero. As it is counting output signals are gneerated on Q1 and Q2 of 769. When the net count reaches zero a low level is generated at the Q4 output which inhibits the pulse generator 772 and thus inhibits further counting. This signals is also communicated via exclusive OR gate 773 (operating as an invertor) and terminal 725, POSN, through Test Control 600 and back to the computer which then knows that the stepper has been commanded into the desired position.

FUNDAMENTALS OF OPERATION

Figure 12A:
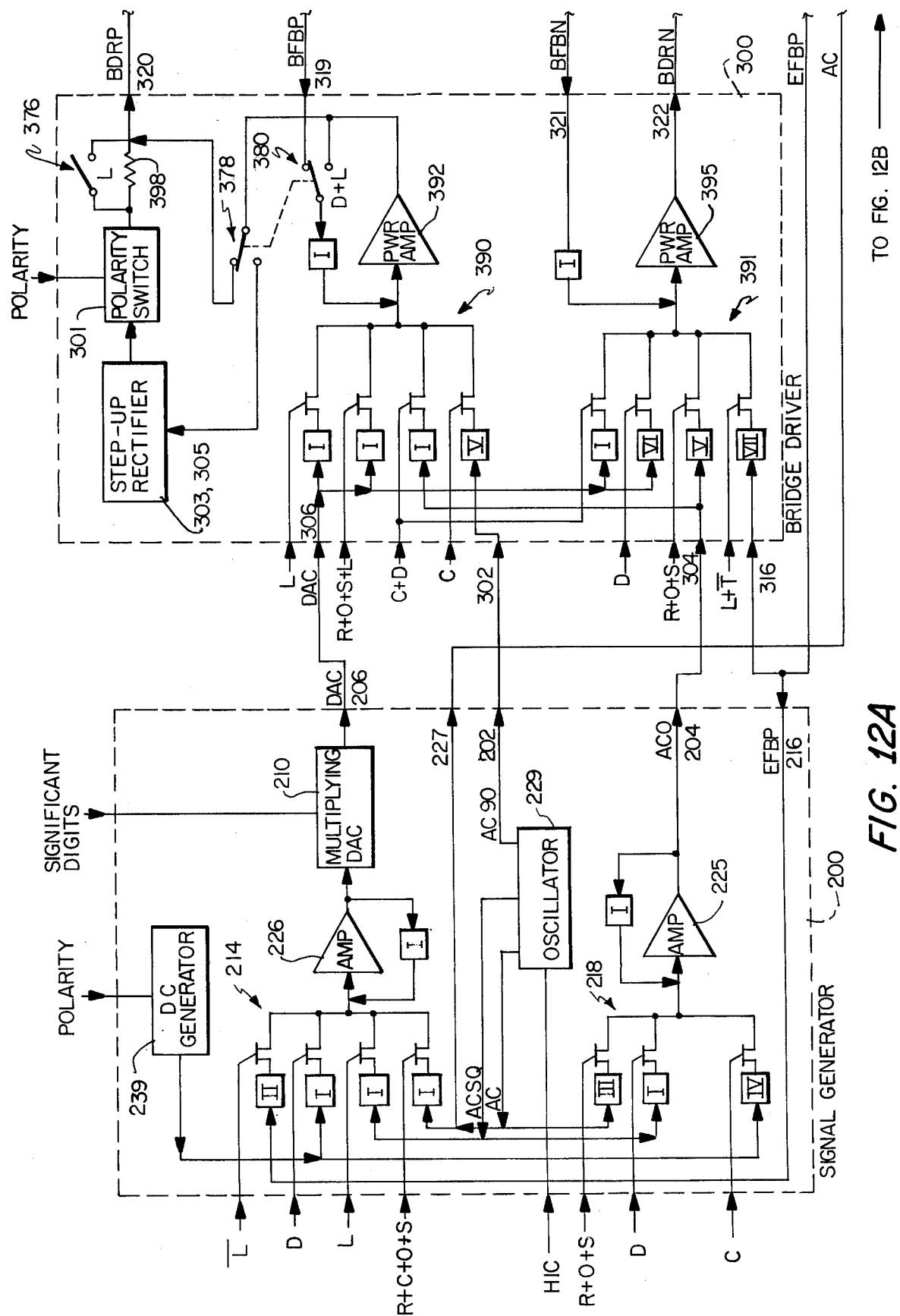
FIGS. 12 A and B are a flowback diagram of the Test Station Electronics.
Figure 12B:
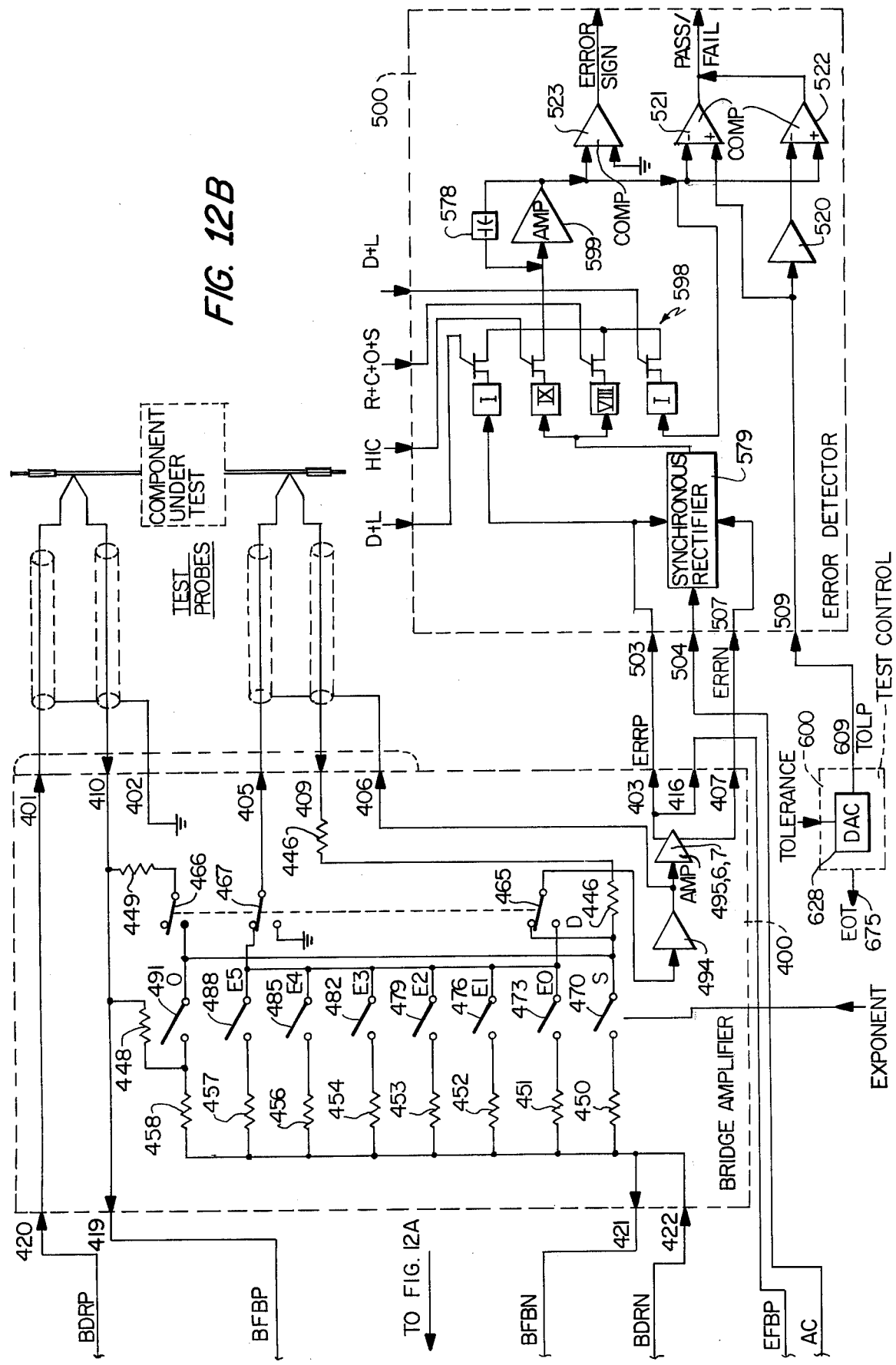

A systematic and logic of FIGS. 3 through 10 are summarized in a flowblock diagram form in FIGS. 12A and 12B. The squares at the input to the various amplifiers each represent an attenuator formed by the resistors at the signal input to the previously described analog gates with selected degrees of attenuation. Similarly, the letters on the gates and switches in the flowblock diagram represent the type of test for the particular analog gate will be enabled as produced by the logic described in FIGS. 3 through 9. Source of the activating signal is Control Logic 100 which is now shown in FIGS. 12A and 12B.

The Sequenced Component Tester of the present invention is essentially a bridge circuit comprised of the component under test (CUT) in the test contacts and reference resistor, selected as a function of the exponent of the value of the CUT and interconnected as a function of the type of test. The bridge in the Bridge-Amplifer 400 is electrically balanced by a pair of AC voltages each generated as a function of the type of test; one modified by the multiplying DAC as a function of the significant digits of the value of the CUT in the Signal Generator 200, and the other fixed in relation to the significant digits of the decade reference resistor. Both are subsequently modified and selectively directed to the bridge as a function of the type of test in Bridge Driver 300. For some test, the pair of signals are DC, either from a DC source in the Signal Generator 200 or AC rectified in the Bridge Driver 300.

Any error in the component value will tend to unbalance the bridge; however, a feedback signal is provided by the amplifier portion of the Bridge-Amplifier 400 to modify the input to the bridge from Signal Generator 200 and Bridge Driver 300 such that a balance is maintained in spite of error. The amplitude of the feedback signal, so produced, is proportional to the percentage error in the test component value (to a degree dependent upon the loop gain of the circuit). Acceptance or rejection of the CUT is determined in the Error Detector 500 by comparing the amplitude of this feetback signal with an acceptable error level (tolerance) signal produced by the Test Control 600 as a function of inputted tolerance acceptance level for the individual CUT.

The requirement that the Sequenced Component Tester be able to make tests on a wide variety of components in rapid succession necessitates that a relatively small amount of hardware serve to handle a wide variety of signals. This also necessitates that a relatively complex network of switching be provided. The flowblock diagram of FIGS. 12A and 12B shows the various signals and circuits which are used, together with the switching which is required to handle the full variety of tests.

The operation of the system will now be considered one test at a time with only the relevant elements of FIGS. 12A and 12B illustrated in their respective equivalent circuit.

RESISTOR TESTS

As illustrated in the equivalent circuit of FIG. 13, the resistor test makes use of a single AC signal AC from the oscillator circuit 229 in the Signal Generator 200. This signal is fed to the multiplying digital-to-analog converter (DAC) 210 via a unity gain inverting amplifier 226 through attenuator analog gate 214. The multiplying DAC 210 attenuates the signal AC in proportion to the value of the two significant digits of the component's nominal value supplied by the Control Logic 100. The output from DAC 210 is fed via attenuator, analog gate 390 and a unity gain power amplifier 392 of the Bridge-Amplifier 400 to drive the component under test (CUT) through switch 378.

The original AC signal AC is also fed via attenuator, analog gate 218, and amplifier 225 in the Signal Generator 200 as signal ACO to a fixed gain attenuator, analog gate 391 and power amplifier 395 in the Bridge Driver 300. The selected gain III of of amplifier 225 scales the signal ACO to signal AC. For example, if the multiplying DAC is scaled to a unity gain with a binary input of one hundred and twenty-eight (eight binary digits) and the system is designed for a maximum count of One Hundred, gain III is selected to be 0.781 or 100/128. The selected gain V of amplifier 395 is scaled to the two significant digits of the resistance value of the reference decade ladder resistors. Depending upon the exponent multiplier of the component under test, one of the reference resistors 451-454, 456, 457 of a decade ladder, in the Bridge-Amplifier 400, is switched into the bridge circuit. A complete bridge driving system is thus formed.

The junction of the resistor under test (CUT) and the reference resistor, for example 456, is at a virtual ground point because of the feedback system. A unity gain, non-inverting amplifier 494 at this point provides drive to the shield of the cable to the test resistor (CUT) assuring neutralization of any stray capacitance and maintenance of a high impedance level at this point. Any unbalance which does exist is amplified by the three amplifiers 495, 496, and 497; one at high gain (voltage limited) and the other two connected as phase splitters of gain 15. One of the outputs is fed back as signal EFBP to the Signal Generator 200 ahead of the DAC 210 via attenuator, analog gate 214 to modify the original signal AC proportional to the CUT is measured percentage error. The gain II of the attenuator for this is .3, such that the amplified error signal is scaled to equal the original signal AC amplitude when the error is 30 percent.

The AC error signal ERRP, ERRN is also fed to the Error Detector 500 where it is synchronously rectified by 579, selectively attenuated by 598, and integrated for a fixed number of cycles of the AC signal AC. The gain VIII is selected as a function of the capacitor 578 of the integrator to provide a net gain of one over the integration period. The use of synchronous rectification assures that only the in-phase component of the error signal is sensed, and a plus or minus voltage generated depending on the polarity of error. This also assures that DC offsets and quadrature signals have negligible effects on the integrated error.

The integrated error is compared in the Error Detector 500 with a pair of bipolar voltage proportional to the acceptable tolerance error by comparators 521 and 522. The acceptable tolerance error signal TOLP is enerated by a 6-bit DAC 628 in the Test Control circuit 600 and used with its inverted counterpart in the Error Detector 500. If the measured (integrated) percentage error is within the two symmetric bipolar voltage levels, representing allowable + or − tolerance, the component under test (CUT) is withing the acceptable limits and a Pass signal is generated. If the tolerance is outside of the two voltage limits, the component is outside of tolerance limits and no Pass signal is generated.

The computer is informed of the end of the test period by the EOT signal (DTF1). It the responds by testing the pass/fail signal $\overline{PAS}$ (DTF2). If the component fails to pass, the equipment is provided with means to measure the actual percentage error. After sensing a Fail condition, the computer may output a Read Tolerance (RTOL) signal (DCP2). At this time, the circuitry enables the tolerance counter 182, 183 in the Control Logic 100 to commence counting (at other times, this counter is merely used as a latch to hold the acceptable tolerance limit value). It will count, increasing the output of the tolerance DAC 628 until a pass signal is obtained or a count overflow (OFLO) condition is reached. In either case, a Tolerance Read (TRED) signal is generated and sensed by the computer via DTF3. The computer then reads the contents of the counters 182, 183 as the measured percentage error overflow condition by addressing and reading from the Test Control 600 the input data lines to the tolerance DAC 628.

CAPACITANCE TESTS

The Capacitance test as illustrated in FIG. 14, makes use of two quadrature AC signals AC and AC90 from the oscillator circuit 229 in the Signal Generator 200. The multiplying DAC 210 is fed the same AC signal AC with unit gain as in the resistor tests. The output of the DAC 210 scaled to the significant digits of the CUT, instead of driving the component under test via a power amplifier 392, drives the reference resistor via gain-of-one attenuator, analog gate 391 and power amplifier 395.

The quadrature output of the oscillator AC90 bypasses the buffer amplifiers 225 and 226 of the Signal Generator 200 and goes directly to the power amplifier 392 via attenuator, analog gate 390 in the Bridge Driver 300 to drive the CUT. The selected gain V of amplifier 392 is scaled to the two significant digits of the reference resistor decade ladder. For testing of large capacitors, 10-100 uf (exponent6), the frequency of the test signal is decreased by a factor of ten by relays in the Signal Geneator 200 as described in the discussion of FIGS. 4A and 4B.

For electrolytic or other polarized capacitors, a bias voltage is added to the AC test signal AC90 to prevent reverse polarity voltages from being applied to these capacitors. In this case, a DC voltage from DC generator 239, depending upon the polarity called for in the test description, is fed via attenuator, analog gate 218 and buffer amplifier 225 in the Signal Generator 200 to the Bridge Driver 300. The output from this circuit is then added via attenuator, analog gate 390 (unity gain) at amplifier 392 to the AC test signal AC90 used to drive the CUT in the Bridge Driver 300. The gain IV of attenuator 218 scales the DC voltage to the AC peak voltage, so that when they are added, a level shift of the AC voltage produces a unipolar AC signal. The error sensing circuitry operates in exactly the same manner as for resistor testing.

LEAKAGE TESTS

The Leakage test, as illustrated in FIG. 15, makes use of the flat topped AC signal ACSQ from the oscillator circuit 229 in the Signal Generator 200 to generate a test voltage for electrolytic capacitors and diodes. This initial signal, a sine wave clipped to a flat topped amplitude, is fed via the the attenuator, analog gate 214 and buffer amplifier 226 at unit gain to the multiplying DAC 210. The DAC 210. The DAC 210 provides a voltage scaled to a fixed fraction of the rated voltage of the CUT. This is fed to two unity gain inputs of a power amplifier 392 via attenuator, analog gate 390 in the Bridge Driver 300, giving a net gain of two for this amplifier. Relays change switch 378 to divert the output of the amplifier 392 from driving the component under test directly to driving a 1:10 set-up transformer 303. The secondary of transformer 303 feeds a bridge rectifier 305 to give a voltage of nominally about 0.9 times the voltage specified in the test description. A polarity switch circuit 301 selectively grounds one or the other output of the rectifier 305 and connects via switch 376 the opposite side to the Component Under Test giving the specified polarity.

For the leakage test, no balancing voltage is provided for the bridge circuit; instead, the circuitry operates as a feedback amplifier. Any leakage current present generates an output voltage via the error amplifier 495 in the Bridge-Amplifier 400. This voltage is fed back via attenuator, analog gate 391 and the power amplifier 395 in the Bridge Driver 300 and one of the decade feedback resistors, depending upon the decade range of the allowable leakage current. The selected gain VII of attenuator, analog gate 391 scales the feedback signal to the leakage current. The synchronous rectifier 579 is made inoperative and the integrator is made to operate as a gain-of-one amplifier. The comparator circuits operate as before comparing the measured leakage voltage against a pair of acceptable limit voltage level fed from the "tolerance" DAC 628.

DIODE AND ZENER DIODE TESTS

Both the diode and zener tests employ the same circuitry, the only difference being in the operation of the orientation lamps on the operator's panel which for the zener diode test reversed relative to the voltage applied to the CUT for the diode test. The diode tests are a composite of the resistor, capacitor and the leakage tests. The diode test, as illustrated in FIG. 16, makes use of the flat topped AC signal ACSQ of the oscillator circuit 229 in the Signal Generator 200 to generate a fixed high level DC voltage to drive the diode via current limiting resistor 398. The signal ACSQ is connected to the step-up transformer 303 via unity gain attenuator, analog gate 218, and the buffer amplifier 225 in the Signal Generator 200 and unity gain attenuator, analog gates 390, power amplifier 392 and switch 378 in the Bridge Driver 300. This signal drives the diode under test via the step-up transformer 303, bridge rectifier 305 and polarity switch 301 as in the leakage tests, and additionally via resistor 398. Because the desired measurement is the voltage drop across the diode, the low end of the test diode is switched to ground by switch 467 (rather than being connected to a reference resistor). The voltage drop is then sensed by a fixed resistor 449 which is switched into the bridge circuit and connected from the high end of the CUT to a reference resistor 454 by 466 and 482 respectively and the error amplifier 495 by switch 465.

To make the voltage comparison, the DC generator 239, in the Signal Generator 200, feeds a DC voltage via the unity attenuator, analog gate 214 and amplifier 226 to the multiplying DAC 210. As in the resistor and capacitor cases, the gain of the DAC 210 is set to produce a voltage proportional to the two significant digits of the programmed diode voltage characteristic. This DC signal is fed via the Power Amplifier 395 in the Bridge Driver 300, using two inputs of the analog gate 391 giving a net gain of $1 + \frac{1}{3} = 4/3$. The resultant voltage drives one of the reference decade resistors ad designated by the programmed exponent. Since a resistance ration of 1:1, 1:10, or 1:.1 is formed between the resistor 449 and the selected decade resistor; a voltage ratio is established accordingly between the tested diode and the generated voltage. Any error in the voltage of the diode under test is amplified and fed back as EFBP to the initial attenuator 214 (ahead of the multiplying DAC 210) modifying the initial DC voltage so as to bring the system into balance. By the use of a gain II as 0.3 of the attenuator, the error voltage generated is scaled to 30% error equals the DC voltage input. (as noted before)

The error detector circuit is operated as for the leakage tests at a 1:1 gain level into the voltage comparator without integration. The comparator reference here again is determined by the tolerance limit specified in the programmed test description. The remaining aspects of error detection are as described in the resistor test.

OPENS AND SHORTS

Tests for these conditions are special cases of the resistor tests.

For the case of shorts, as illustrated in FIG. 17, a resistor 450 (100 ohm for example) is switched by switch 470 in the reference resistor leg below a similar resistor 446 permanently in the input to the error amplifier 495. The input to the multiplying DAC 210 is programmed to match the attenuation in the reference leg of the bridge regardless of any numbers which may have been given in the test description. With the tolerance DAC 628 set for 10%, the equipment is set to pass when $R_{CUT} + 100$ ohm $\leq 100 + 10\%$. Thus, a maximum resistance of 10 ohms is permitted. If any other tolerance is specified, a corresponding maximum value of resistance is sensed. If for example a tolerance of two is specified, $R_{CUT} + 100 = 100 + 2\%$, or $R_{CUT} \leq 2$ ohms. Thus, impedances greater than 2 ohms will be rejected.

For the case of opens, as illustrated in FIG. 18, an internal resistance divider 448 and 458 of 1 M ohm and 500 K ohm respectively is used. This divider is permanently tied across the bridge but is switched into the bridge balance circuit by switch 491 only during Open tests. In this case, the multiplying DAC 210 is controlled to provide a gain of twice the value of the reference resistance leg regardless of any numbers in the test description. If the tolerance is set to 10% the test then measures the parallel combination of $R_{CUT}$ and 1 Meg of $$\frac{R_{OUT} \times 1 \text{ Meg}}{R_{OUT} + 1 \text{ Meg}} \leq (1 \text{ Meg} \leq 10\%)$$

i.e., the 10% test senses $R_{OUT} \geq 9$ Meg. Other tolerance values are tested as specified; a 2% tolerance gives $R_{OUT} \geq 49$ Meg; 5% gives $R_{OUT} \geq 19$ Meg. etc.

SYSTEM TIMING

Almost as significant as the technique of the individual measurements is the control of the circuitry to implement the measurement.

Figure 11:
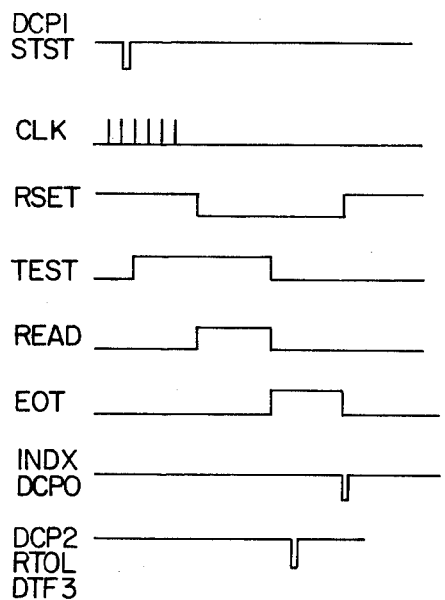
FIG. 11 is an illustration of the timing signals.

All data describing the tests are transferred from the computer to the hardware by the Control Logic 100. The implementation of the tests is governed by the various timing signals generated in the Test Control 600 in response to basic computer commends. The relationship of the control signals are illustrated in FIG. 11.

The index pulse (DCPO) has as its primary function the initiating of the operation of the Stepping Motor 800 to advance to the test of the next component. This pulse also serves to terminate all aspects of the preceding test, namely: it resets all the test-describing memory elements (latches) in Logic Control 100, discharges the integrator holding the previous test results in Error Detector 500 and it assures that all the timing flip-flops are reset in Test Control 600. When the Stepper Motor Drive 700 steps four or eight steps (depending upon a 0.2 inch or 0.4 inch pitch), an In-Position signal (IPOS) is activated and read by the computer test function line (DTFO). As this does not truly indicate an in-position status, but rather only that the final position has been commanded to the stepper motor, the computer waits about 30 msec. before it initiates a test measurement.

During this interval (which can also be initiated by the Start, Single Cycle or Retest pushbutton inputs from the operator control panel), the computer outputs the new test description to At the end of the 30 msec. period, the computer outputs a Start Test pulse (DCP1). This serves to preset an eight-bit counter 684, 685 (twelve bits for leakage tests including counter 683) in Test Control circuit 600 to −24 and reiterate the resetting of several latch circuits in the Test Control circuit 600. The presetting of the counter also enables it to count using a clock pulse generated in the Test Control circuit 600 at both axis crossovers of the test signal. The start test pulse STST also triggers a TEST control signal flip-flop 642 allowing the computer-specified test to be initiated.

After the counter has counted up to zero from its reset value, a READ SIGNAL is generated; thus, twelve cycles of the test waveform (or an equivalent amount of time for DC tests) are applied to the system to allow the test circuit waveforms to stabilize before initiating actual error measurement. The READ signal enables the inputs of the error integrator in the Error Detector 500. At the same time, integrator reset (RSET) is lifted allowing the integrator to operate. When the counter then reaches a counter of 64 (32 more cycles of applied signal), the TEST and READ signals are both terminated and an End-of-Test (EOT) signal generated. The latter is read by the computer by DTF1, after which the computer reads the results of the test on the gated Pass/Fail line (PAS) by DTF2.

The leakage tests employ a slightly different timing philosophy. It is necessary to increase the allowable test time to permit capacitors to become charged and yet it is not desirable to increase the test gime for leakage tests of diode or small capacitor. To accommodate these conflicting requirements, two aspects of the test are changed; (a) the time allotted for the tests is increased by a factor of 16 (4-bit counter 683 is enabled ahead of the 8-bit counter 684, 685 previously mentioned) and (b) the test is arbitrarily terminated as soon as the measured leakage current is below the specified maximum value (this is possible because no integration is required in these tests). Remaining aspects of the leakage tests are as described above.

In the event of a fail condition being read by the controller for any test, a second test is automatically made before any fail condition is displayed or printed out. This assures that no parts are erroneously rejected due to momentary contact problems.

From the preceding description of the preferred embodiment, it is evident that the objects of the invention are obtained. The sequence component tester of the present invention provides a digitally controlled bridge making maximum use of digital logic and minimizing the number of resistance and mechanical switching required. A digitally controlled attenuator modifies the drive signal to the bridge as a function of the significant digits of the component under test and a member of a decade resistive ladder is selected as a standard or reference resistance as a function of the exponent of the value of the component under test. Thus the present invention provides an electrically modified signal to a bridge to permit the use of a minimum number of reference resistances. Analog switches are used to control the source of the AC and DC signals used to generate the drive and reference signals as well as control the formation of the bridge circuit. The error detector circuit similarly includes analog switches to inhibit or bypass the synchronous rectifier and integrator provided therein. Although specific digital logic is shown to perform the functions of the sequence tester of the present invention, it is apparant that other logic may be used. The location of specific functions in circuit of assemblies are mere examples and may be located in other assemblies. For example, the digital to analog converter of the tolerance binary signal to an analog signal may be provided other than in the Test Control 600.

Although the invention has been described and illustrated in detal, it is clearly to be understood that the same is by way of illustration and example only and it is not to be taken by way of limitation. The spirit and scope of this invention is to be limited only by terms of the appended claims.

What is claimed:

1. An electrical component sequence tester for a plurality of components of nominal values presented in a predetermined sequence comprising:

a pair of contacts for electrically engaging in sequence a component therebetween;

means for forming a two legged bridge using said component between said pair of contacts as a first leg in series with a selected resistance chosen out of a limited plurality of resistors as a second leg;

means for generating a fixed voltage reference signal and a variable voltage test signal, said means for generating a fixed voltage reference signal including a fixed voltage source inputted to a fixed gain amplifier device; and said means for generating a variable voltage test signal including said fixed voltage source inputted to a variable gain amplifier device, said reference signal being the output of said fixed gain amplifier device, and said test signal being the output of said variable gain amplifier device;

means for selectively applying said reference signal and said test signal each to an opposite end on said bridge;

means for feeding back the output signal at the junction between said legs of said bridge to said generating means to electrically balance said bridge, said output signal being zero when the nominal value and the actual value of the component on test are equal, said output signal being finite when the nominal value and the actual value of the component on test are unequal;

means for comparing the output signal at the junction between said legs of said bridge with a predetermined voltage value, said comparison being indicative of the difference between said nominal value and said actual value of the component on test; and means for controlling said forming means, said generating means, said applying means and said comparing means as a function of the type of test to be performed, the nominal value of the electrical component and an acceptable value of deviation between said nominal value and said actual value.

2. The electrical component sequence tester of claim 1 wherein said forming means automatically selects a single member of said limited plurality of resistors as a function of the nominal value of each electrical component on test in sequence and said first leg is connected to said test signal as a function of the type of component then on test and the type of test, said refererence signal being connected to said second leg.

3. The electrical component sequence tester of claim 2 wherein for a test of an open in said component on test, said forming means forms a bridge having a first resistor connected in parallel with said pair of contacts.

4. The electrical component sequence tester of claim 2 wherein for a test of a short circuit in said component on test said forming means forms a bridge having a second resistor in series with said component on test to form said first leg.

5. The electrical component sequence tester of claim 1 wherein for a diode test:

said forming means grounds one end of a diode and places a first resistor in series with said diode; and said applying means connects said reference signal to the function of said diode and said first resistor and said test signal to said selected member of said limited plurality of resistors.

6. The electrical component sequence tester of claim 1 wherein for a leakage test:

said applying means connects the output source to said selected member of said decade ladder; and said generating means provides only a test signal.

7. The electrical component sequence tester of claim 1 wherein said comparing means includes:

means for synchronously rectifying said output signal of said bridge;

means for integrating the rectified output; and means for comparing the integrated output with said acceptable value of deviation.

8. The electrical component sequence tester of claim 7 wherein said control means directs said comparing means to bypass said synchronous rectifying means and said integrating means for leakage and diode tests.

9. The electrical component sequence tester of claim 1 wherein said control means includes a digital to analog converter for converting a binary number representing acceptable value of deviation to a proportional voltage signal for use in said comparing means as said predetermined level.

10. The electrical component tester of claim 1 wherein said limited plurality of resistors includes a decade resistance ladder.

11. The electrical component tester of claim 1 wherein said forming means automatically selects a single member of said limited plurality of resistors as a function of the nominal value of each electrical component on test in sequence and said second leg is connected to said test signal as a function of the type of component then on test and the type of test, said reference signal connected to said first leg.

12. The electrical component sequence tester of claim 1 wherein said feedback means combines the output of said test signal with said test signal to balance said bridge.

13. The electrical component sequence tester of claim 12 wherein said generating means includes means for varying the amplitude of a first signal as a function of the significant digits of the value of the electrical component to produce said test signal.

14. The electrical component sequence tester of claim 13 wherein said varying means is a multiplying digital to analog converter for attenuating said first signal by a binary number representing said significant digits.

15. The electrical component sequence tester of claim 12 wherein for a resistor test:

said test signal and said reference signal are AC signals; and said applying means connects said test signal to the resistance under test and said reference signal to said selected member of said limited plurality of resistors.

16. The electrical component sequence tester of claim 12 wherein for a capacitor test:

said test signal and said reference signal are AC signals 90° out of phase; and said applying means connects said test signal to said selected member of said limited plurality of resistors and said reference signal to the capacitor under test.

17. The electrical component sequence tester of claim 16 wherein said generating means includes means for shifting the level of said reference signal as a function of polarity of the capacitor under test to generate a unipolar reference signal.

18. The electrical component sequence tester of claim 16 wherein said control means decreases the frequency of said test signal and said reference signal for testing high values of capacitance.

19. The electrical component sequence tester of claim 12 wherein for diode test:

said test signal and said reference signal are DC signals;

said forming means grounds one end of a diode under test and connects the other end of said diode through a first resistor to said selected member of said limited plurality of resistors; and said applying means connects said test signal to said selected member of said limited plurality of resistors and said reference signal to the junction of said first resistor and said diode under test.

20. In a digitally controlled bridge having contacts for receiving an electrical component to be tested as one leg of the bridge and an AC signal generator, the improvement comprising: means for rectifying said AC signal; and polarity means for selectively coupling the rectified signal of a single polarity to said bridge in response to a binary polarity command, said polarity means includes:

four photo responsive switching means connected as a bridge across the output of said rectifying means; and two photo source means responsive to opposite binary polarity commands for activating opposite diagonal pairs of said photo responsive switching means to select said single polarity of said rectified signal.

21. The digitally controlled bridge of claim 20 wherein said photo responsive switching means are photo transistors and said two photo source means each includes a pair of light emitting diodes connected in series.

22. An electrical component tester comprising:
means for forming a two-legged bridge using said component on test as a first leg in series with a selected resistance chosen out of a limited plurality of resistors as a second leg;
means for generating a reference signal and a variable voltage test signal, said means for generating a variable voltage test signal including a voltage source inputted to a variable gain amplifier device, and said test signal being the output of said variable gain amplifier device;
means for selectively applying said reference signal and said test signal each to an opposite end on said bridge;
means for feeding back the output signal at the junction between said legs of said bridge to said generating means to electrically balance said bridge, said output signal being zero when the impedance ratio of said legs equals a preferred value, said output signal being finite when the impedance ratio of said legs deviates from said preferred value;
means for displaying the output signal at the junction between said legs of said bridge, said display being indicative of the value of said component on test.

23. The bridge of claim 22 wherein for capacitor test:
said test signal means and said reference signal means generate AC signal to 90 degrees out of phase; and said applying means connects said test signal to the selected resistance and said reference signal to the capacitor to be tested.

24. The bridge of claim 23 wherein for test of polarity sensitive capacitors:
said reference signal means includes means for shifting the level of said reference signal as a function of polarity of the capacitor under test to generate a unipolar AC reference signal.

25. An electrical component tester of claim 22 further comprising:
means for synchronously rectifying said output signal of said bridge;
means for integrating the rectified output; and
means for comparing the integrated output with an acceptable value of deviation.

26. The component tester of claim 22 further including:
means for generating a tolerance signal as a function of acceptable level of percentage deviation, said tolerance signal means including a digital to analog converter for converting a binary word representing said acceptable level of percentage deviation to a proportional tolerance voltage signal; and
means for comparing the output signal of said bridge and said tolerance signal.

27. The bridge of claim 26 wherein:
said comparing means provides a fail signal when said bridge output signal exceeds said tolerance signal;
said tolerance signal means includes memory means for storing said binary word, logic means for incrementing said memory means in response to a fail signal until said fail signal ceases; and
means for reading out the binary word in said memory means.

* * * * *